(12) United States Patent
Beall et al.

(10) Patent No.: US 11,192,818 B2
(45) Date of Patent: Dec. 7, 2021

(54) ION EXCHANGEABLE, TRANSPARENT GAHNITE-SPINEL GLASS CERAMICS WITH HIGH HARDNESS AND MODULUS

(71) Applicant: CORNING INCORPORATED, Corning, NY (US)

(72) Inventors: George Halsey Beall, Big Flats, NY (US); John Philip Finkeldey, Elkland, PA (US); Alexandra Mitchell, Ithaca, NY (US); Charlene Marie Smith, Corning, NY (US); Steven Alvin Tietje, Lindley, NY (US)

(73) Assignee: CORNING INCORPORATED, Corning, NY (US)

( * ) Notice: Subject to any disclaimer, the term of this patent is extended or adjusted under 35 U.S.C. 154(b) by 201 days.

(21) Appl. No.: 16/202,588

(22) Filed: Nov. 28, 2018

(65) Prior Publication Data

US 2019/0161397 A1    May 30, 2019

Related U.S. Application Data

(60) Provisional application No. 62/592,844, filed on Nov. 30, 2017.

(51) Int. Cl.
*C03C 10/00* (2006.01)
*C03C 4/18* (2006.01)
(Continued)

(52) U.S. Cl.
CPC .......... *C03C 10/0045* (2013.01); *C03B 32/02* (2013.01); *C03C 3/062* (2013.01);
(Continued)

(58) Field of Classification Search
CPC .... B65D 13/02; B65D 1/0207; H05K 5/0017; H05K 5/03; C03C 10/0027;
(Continued)

(56) References Cited

U.S. PATENT DOCUMENTS 3,681,102 A    8/1972  Beall
4,687,750 A    8/1987  Pinckney
(Continued)

FOREIGN PATENT DOCUMENTS

EP    0869105    *  3/2002
EP    2450320 A1    5/2012
(Continued)

OTHER PUBLICATIONS

Molla et al. "Crystallization, mechanical, and optical properties of transparent, nanocrystalline gahnite glass-ceramics." Journal of the American Ceramic Society, 2017, 100: pp. 1963-1975.
(Continued)

*Primary Examiner* — Yan Lan
(74) *Attorney, Agent, or Firm* — Kevin M. Johnson

(57) ABSTRACT

A transparent gahnite-spinel glass ceramic is provided. The glass ceramic includes a first crystal phase including $(Mg_xZn_{1-x})Al_2O_4$ where x is less than 1 and a second crystal phase including tetragonal $ZrO_2$. The glass ceramic may be ion exchanged. Methods for producing the glass ceramic are also provided.

23 Claims, 9 Drawing Sheets

(51) Int. Cl.
*C03C 21/00* (2006.01)
*C03B 32/02* (2006.01)
*H05K 5/03* (2006.01)
*H05K 5/00* (2006.01)
*C03C 4/00* (2006.01)
*C03C 3/085* (2006.01)
*C03C 3/11* (2006.01)
*C03C 3/062* (2006.01)
*B65D 13/02* (2006.01)
*B65D 1/02* (2006.01)

(52) U.S. Cl.
CPC ............ *C03C 3/085* (2013.01); *C03C 3/111* (2013.01); *C03C 4/0092* (2013.01); *C03C 4/18* (2013.01); *C03C 10/0027* (2013.01); *C03C 10/0036* (2013.01); *C03C 10/0054* (2013.01); *C03C 21/002* (2013.01); *H05K 5/0017* (2013.01); *H05K 5/03* (2013.01); *B65D 1/0207* (2013.01); *B65D 13/02* (2013.01); *C03C 2204/00* (2013.01); *Y10T 428/131* (2015.01)

(58) Field of Classification Search
CPC ............ C03C 10/0036; C03C 10/0045; C03C 10/0054; C03C 21/002; C03C 2204/00; C03C 3/062; C03C 3/085; C03C 3/111; C03C 4/0092; C03C 4/18; C03B 32/02; Y10T 428/131
See application file for complete search history.

(56) References Cited

U.S. PATENT DOCUMENTS

| | | | |
|---|---|---|---|
| 5,476,821 | A | 12/1995 | Beall et al. |
| 5,491,116 | A | 2/1996 | Beall et al. |
| 5,968,857 | A | 10/1999 | Pinckney |
| 6,245,411 | B1 | 6/2001 | Goto et al. |
| 6,248,678 | B1 | 6/2001 | Pinckney |
| 8,853,110 | B2 | 10/2014 | Almoric et al. |
| 2005/0096208 | A1 | 5/2005 | Zachau et al. |
| 2010/0242715 | A1 | 9/2010 | Raichel et al. |
| 2016/0102011 | A1 | 4/2016 | Hu et al. |
| 2016/0355434 | A1 | 12/2016 | Momono |
| 2017/0283307 | A1 | 10/2017 | Yuan et al. |

FOREIGN PATENT DOCUMENTS

| | | | |
|---|---|---|---|
| EP | 2754739 | * | 12/2016 |
| WO | 2007/144875 | A1 | 12/2007 |
| WO | 2008130366 | A1 | 10/2008 |

OTHER PUBLICATIONS

Pinckney, "Transparent, high strain point spinel glass-ceramics." Journal of Non-Crystalline Solids, 1999, 255(2): pp. 171-177.
Dittmer et al. "Crystallization and mechanical properties of MgO/Al2O3/SiO2/ZrO2 glass ceramics with and without the addition of yttria", Solid State Sciences 13(12) 2011, pp. 2146-2153.
International Search Report and Written Opinion PCT/US2018/063207 dated Mar. 1, 2019, 12 Pgs.

* cited by examiner

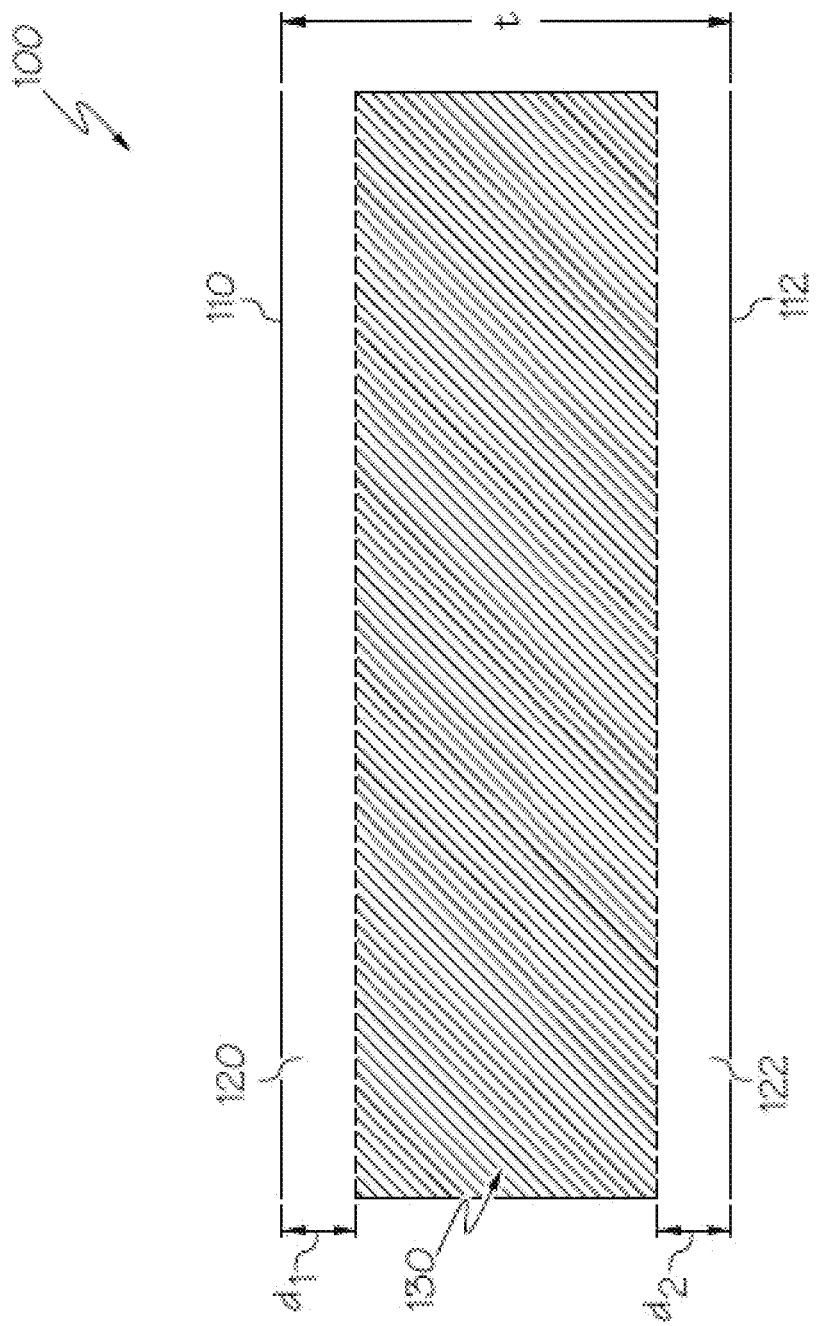

ION EXCHANGEABLE, TRANSPARENT GAHNITE-SPINEL GLASS CERAMICS WITH HIGH HARDNESS AND MODULUS

CROSS-REFERENCE TO RELATED APPLICATIONS

This application claims the benefit of priority of U.S. Provisional Application Ser. No. 62/592,844 filed on Nov. 30, 2017, the contents of which are relied upon and incorporated herein by reference in their entirety.

FIELD

The present specification generally relates to transparent glass ceramic compositions. More specifically, the present specification is directed to transparent gahnite-spinel glass ceramics that may be formed into cover glass or housings for electronic devices.

Technical Background

Portable electronic devices, such as, smartphones, tablets, and wearable devices (such as, for example, watches and fitness trackers) continue to get smaller and more complex. As such, materials that are conventionally used on at least one external surface of such portable electronic devices also continue to get more complex. For instance, as portable electronic devices get smaller and thinner to meet consumer demand, the display covers and housings used in these portable electronic devices also get smaller and thinner, resulting in higher performance requirements for the materials used to form these components.

Accordingly, a need exists for materials that exhibit higher performance, such as resistance to damage, for use in portable electronic devices.

SUMMARY

According to aspect (1), a glass-ceramic is provided. The glass ceramic comprises: a first crystal phase including $(Mg_xZn_{1-x})Al_2O_4$ where x is less than 1; and a second crystal phase including tetragonal $ZrO_2$. The glass-ceramic is transparent in the visible range.

According to aspect (2), the glass-ceramic of aspect (1) is provided, further comprising at least one of $Li_2O$ and $Na_2O$.

According to aspect (3), the glass-ceramic of aspect (1) or (2) is provided, further comprising $Li_2O$ and $Na_2O$.

According to aspect (4), the glass-ceramic of any of aspects (1) to (3) is provided, wherein x is greater than 0.

According to aspect (5), the glass-ceramic of any of aspects (1) to (4) is provided, further comprising about 35 mol % to about 70 mol % $SiO_2$.

According to aspect (6), the glass-ceramic of any of aspects (1) to (5) is provided, further comprising: about 35 mol % to about 60 mol % $SiO_2$; greater than about 13 mol % $Al_2O_3$; greater than about 8 mol % ZnO; 0 mol % to about 8 mol % MgO; and greater than 0 mol % to about 10 mol % $ZrO_2$.

According to aspect (7), the glass-ceramic of any of aspects (1) to (6) is provided, further comprising: 0 mol % to about 6 mol % $TiO_2$; 0 mol % to about 10 mol % $Na_2O$; 0 mol % to about 8 mol % $Li_2O$; 0 mol % to about 10 mol % $HfO_2$; 0 mol % to about 0.1 mol % $As_2O_5$; and 0 mol % to about 0.3 mol % $SnO_2$.

According to aspect (8), the glass-ceramic of any of aspects (1) to (7) is provided, wherein $ZrO_2+TiO_2+HfO_2 \geq$ about 5 mol %.

According to aspect (9), the glass-ceramic of any of aspects (1) to (8) is provided, wherein the glass ceramic is substantially free of $TiO_2$.

According to aspect (10), the glass-ceramic of any of aspects (1) to (9) is provided, wherein the glass ceramic exhibits a crystallinity of at least about 10 wt %.

According to aspect (11), the glass-ceramic of any of aspects (1) to (10) is provided, wherein the glass ceramic has a transmittance of at least about 90% in the visible range.

According to aspect (12), the glass-ceramic of any of aspects (1) to (11) is provided, wherein the glass ceramic is substantially colorless.

According to aspect (13), the glass-ceramic of any of aspects (1) to (12) is provided, wherein the first crystal phase has a crystallite size of less than about 10 nm.

According to aspect (14), the glass-ceramic of any of aspects (1) to (13) is provided, further comprising a compressive stress region extending from a surface of the glass ceramic to a depth of compression.

According to aspect (15), the glass-ceramic of any of aspects (1) to (14) is provided, wherein the glass ceramic has a hardness of at least about 9 GPa.

According to aspect (16), the glass-ceramic of any of aspects (1) to (15) is provided, wherein the glass ceramic has a Young's modulus of at least about 98 GPa.

According to aspect (17), a consumer electronic product is provided. The consumer electronic product comprises: a housing comprising a front surface, a back surface and side surfaces; electrical components at least partially within the housing, the electrical components comprising at least a controller, a memory, and a display, the display at or adjacent the front surface of the housing; and a cover substrate disposed over the display. At least a portion of at least one of the housing or the cover substrate comprises the glass ceramic of any of aspects (1) to (16).

According to aspect (18), a method is provided. The method comprises: ceramming a precursor glass to form a glass ceramic that is transparent in the visible range. The glass ceramic comprises: a first crystal phase including $(Mg_xZn_{1-x})Al_2O_4$ where x is less than 1; and a second crystal phase including tetragonal $ZrO_2$.

According to aspect (19), the method of aspect (18) is provided, further comprising forming nuclei in the precursor glass prior to the ceramming.

According to aspect (20), the method of aspect (19) is provided, wherein the forming nuclei comprises heat treating the precursor glass at a temperature of at least about 700° C. for a time period of at least about 1 hour.

According to aspect (21), the method of any of aspects (18) to (20) is provided, wherein the ceramming comprises heat treating the precursor glass at a temperature of at least about 750° C. for a time period of at least about 30 minutes.

According to aspect (22), the method of any of aspects (18) to (21) is provided, further comprising ion exchanging the glass ceramic.

According to aspect (23), the method of aspect (22) is provided, wherein the ion exchanging comprises contacting the glass ceramic with a mixed ion exchange bath.

According to aspect (24), a glass composition is provided. The glass composition comprises: about 35 mol % to about 60 mol % $SiO_2$; greater than about 13 mol % $Al_2O_3$; greater than about 8 mol % ZnO; 0 mol % to about 8 mol % MgO; and greater than 0 mol % to about 10 mol % $ZrO_2$.

According to aspect (25), the glass composition of aspect (24) is provided, further comprising: 0 mol % to about 6 mol % $TiO_2$; 0 mol % to about 10 mol % $Na_2O$; 0 mol % to about 8 mol % $Li_2O$; 0 mol % to about 10 mol % $HfO_2$; 0 mol % to about 0.1 mol % $As_2O_5$; and 0 mol % to about 0.3 mol % $SnO_2$.

Additional features and advantages will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments and are incorporated into and constitute a part of this specification. The drawings illustrate the various embodiments described herein and, together with the description, serve to explain the principles and operations of the claimed subject matter.

BRIEF DESCRIPTION OF THE DRAWINGS

FIG. 1 schematically depicts a cross section of a glass ceramic having compressive stress layers on surfaces thereof according to embodiments disclosed and described herein;

DETAILED DESCRIPTION

Figure 2A:
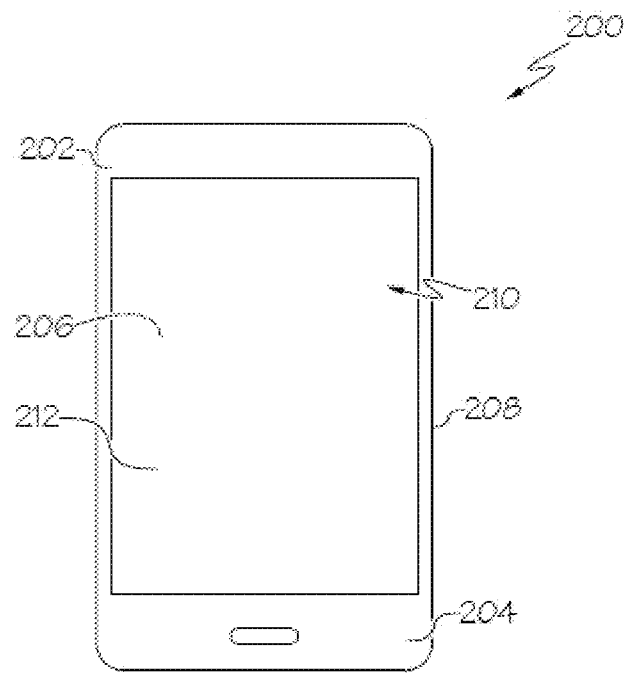
FIG. 2A is a plan view of an exemplary electronic device incorporating any of the glass ceramic articles disclosed herein.

Reference will now be made in detail to transparent gahnite-spinel glass ceramics according to various embodiments. In particular, the transparent gahnite-spinel glass ceramics have a high hardness, and may be ion exchanged. Therefore, the transparent gahnite-spinel glass ceramics are suited for use as display covers and housings in portable electronic devices.

In the following description, like reference characters designate like or corresponding parts throughout the several views shown in the figures. It is also understood that, unless otherwise specified, terms such as "top," "bottom," "outward," "inward," and the like are words of convenience and are not to be construed as limiting terms. Whenever a group is described as consisting of at least one of a group of elements or combinations thereof, it is understood that the group may consist of any number of those elements recited, either individually or in combination with each other. Unless otherwise specified, a range of values, when recited, includes both the upper and lower limits of the range as well as any ranges therebetween. As used herein, the indefinite articles "a," "an," and the corresponding definite article "the" mean "at least one" or "one or more," unless otherwise specified. It also is understood that the various features disclosed in the specification and the drawings can be used in any and all combinations.

Unless otherwise specified, all compositions of the glasses described herein are expressed in terms of mole percent (mol %), and the constituents are provided on an oxide basis. Unless otherwise specified, all temperatures are expressed in terms of degrees Celsius (° C.).

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. For example, a glass that is "substantially free of $K_2O$" is one in which $K_2O$ is not actively added or batched into the glass, but may be present in very small amounts as a contaminant, such as in amounts of less than about 0.01 mol %. As utilized herein, when the term "about" is used to modify a value, the exact value is also disclosed.

The glass ceramics contain a first crystal phase, a second crystal phase, and a residual glass phase. The first crystal phase may be the predominant crystal phase, defined herein as the crystal phase that accounts for the largest fraction of the glass ceramic by weight. Accordingly, the second crystal phase may be present in a weight percent of the glass ceramic that is less than the weight percent of the first crystal phase. In some embodiments, the glass ceramic may include more than two crystal phases.

In embodiments, the first crystal phase includes $(Mg_xZn_{1-x})Al_2O_4$, where x is less than 1. The crystal phase $(Mg_xZn_{1-x})Al_2O_4$ may be generally referred to as a gahnite-spinel solid solution, with the understanding that where x is zero the crystal phase is pure gahnite. In embodiments, x may be greater than or equal to 0, such as greater than or equal to about 0.1, greater than or equal to about 0.2, greater than or equal to about 0.3, greater than or equal to about 0.4, greater than or equal to about 0.5, greater than or equal to about 0.6, greater than or equal to about 0.7, greater than or equal to about 0.8, or greater than or equal to about 0.9. In embodiments, x may be less than 1.0, such as less than or equal to about 0.9, less than or equal to about 0.8, less than or equal to about 0.7, less than or equal to about 0.6, less than or equal to about 0.5, less than or equal to about 0.4, less than or equal to about 0.3, less than or equal to about 0.2, or less than or equal to about 0.1. It should be understood that, in embodiments, any of the above ranges may be combined with any other range. In embodiments, x may be greater than or equal to 0 to less than 1.0, such as greater than or equal to about 0.1 to less than or equal to about 0.9, greater than or equal to about 0.2 to less than or equal to about 0.8, greater than or equal to about 0.3 to less than or equal to about 0.7, or greater than or equal to about 0.4 to less than or equal to about 0.6, and all ranges and sub-ranges between the foregoing values.

The first crystal phase may have a crystallite size that is small enough to prevent degradation of the transparency of the glass ceramic. Larger crystallite sizes may result in an opaque glass ceramic. In embodiments, the first crystal phase has a crystallite size of less than about 15 nm, such as less than about 14 nm, less than about 13 nm, less than about 12 nm, less than about 11 nm, or less than about 10 nm. The crystallite size as used herein is determined by powder x-ray diffraction (XRD) analysis with a scan from 5 to 80 degrees 2θ, unless otherwise specified. The crystallite size was estimated using the Scherrer equation function available in MDI Jade, the software package utilized for phase identification and quantitative analysis.

In embodiments, the second crystal phase includes tetragonal zirconia ($ZrO_2$). The formation of the tetragonal $ZrO_2$ in the glass ceramic requires the presence of $ZrO_2$ in the precursor glass. Without wishing to be bound by any particular theory, it is believed that the tetragonal $ZrO_2$ crystal phase crystallizes before the $(Mg_xZn_{1-x})Al_2O_4$ crystal phase during ceramming, and acts as a nucleartion site for the $(Mg_xZn_{1-x})Al_2O_4$ crystal phase. Additionally, without wishing to be bound by any particular theory, it is believed that the $TiO_2$ included in the glass ceramic partitions into the tetragonal $ZrO_2$ phase, and acts as a nucleating agent for the tetragonal $ZrO_2$ phase. In some embodiments, the composition of the precursor glass and the ceramming conditions may result in a glass ceramic that includes additional crystal phases beyond those described above.

In embodiments, the total crystallinity of the glass ceramic is high enough to provide enhanced mechanical properties, such as hardness, Young's modulus, and scratch resistance, but low enough that the transparency of the glass ceramic is not degraded. As utilized herein, the total crystallinity is provided in wt % and refers to the sum of the wt % of all the crystal phases present in the glass ceramic. In embodiments, the total crystallinity is greater than or equal to about 10 wt %, such as greater than or equal to about 15 wt %, greater than or equal to about 20 wt %, greater than or equal to about 25 wt %, greater than or equal to about 30 wt %, greater than or equal to about 35 wt %, greater than or equal to about 40 wt %, greater than or equal to about 45 wt %, or greater than or equal to about 50 wt %. In embodiments, the total crystallinity is less than or equal to about 50 wt %, such as less than or equal to about 45 wt %, less than or equal to about 40 wt %, less than or equal to about 35 wt %, less than or equal to about 30 wt %, less than or equal to about 25 wt %, less than or equal to about 20 wt %, or less than or equal to about 15 wt %. It should be understood that, in embodiments, any of the above ranges may be combined with any other range. In embodiments, the total crystallinity of the glass ceramic is from greater than or equal to about 10 wt % to less than or equal to about 50 wt %, such as greater than or equal to about 15 wt % to less than or equal to about 45 wt %, greater than or equal to about 20 wt % to less than or equal to about 40 wt %, or greater than or equal to about 25 wt % to less than or equal to about 35 wt %, and all ranges and sub-ranges between the foregoing values. The total crystallinity of the glass ceramic is determined through Rietveld quantitative analysis of the XRD data gathered as described above. The Rietveld analysis employs a least squares method to model the XRD data and then determine the concentration of phases in the sample based on known lattice and scale factors for the identified phases.

The glass ceramics are transparent. As utilized herein, a glass ceramic is considered transparent when exhibiting a transmittance of at least about 80% in the visible range (380 nm to 760 nm). The transmittance, as utilized herein refers to total transmittance, and is measured with a Perkin Elmer Lambda 950 UV/VIS/NIR spectrophotometer with a 150 mm integrating sphere. The samples were mounted at the sphere's entrance port, allowing for collection of wide angle scattered light. The total transmittance data was collected with the reference Spectralon reflectance disc over the sphere's exit port. The percent of total transmittance (% T) was calculated relative to an open beam baseline measurement. In embodiments, the glass ceramic exhibits a transmittance in the visible range of greater than or equal to about 80%, such as greater than or equal to about 81%, greater than or equal to about 82%, greater than or equal to about 83%, greater than or equal to about 84%, greater than or equal to about 85%, greater than or equal to about 86%, greater than or equal to about 87%, greater than or equal to about 88%, greater than or equal to about 89%, greater than or equal to about 90%, or more.

In embodiments, the glass ceramics are colorless or substantially colorless. As utilized herein, substantially colorless refers to the following color coordinate space: $L^*>90$, $a^*$ from −0.2 to 0.2, and $b^*$ from −0.1 to 0.6. The color coordinates are measured using a UV/Vis/NIR spectrophotometer configured with an integrating sphere. The measurement was carried out over a wavelength of 380 nm to 770 nm with a 2 nm interval with illuminants D65, A, and F2 with a 10° observer. The procedures for determining the color space in the CIE system are described in more detail in "Standard practice for computing the colors of objects by using the CIR system" (ASTM E308-08).

In embodiments, the glass ceramics may have a hardness that renders the glass ceramic less susceptible to damage, such as by providing increased scratch resistance. As utilized herein, the hardness is measured with a nanoindenter and is reported in GPa, unless otherwise indicated. The nanoindenter measurement was performed using a diamond Berkovich tip using the continuous stiffness method as implemented with an Agilent G200 nanoindenter. The continuous stiffness method utilizes a small sinusoidal displacement signal (1 nm amplitude at 45 Hz) superimposed on the tip as it is loaded into the specimen surface, and the load, depth, and contact stiffness are continuously determined. Without wishing to be bound by any particular theory, the hardness of the glass ceramic is believed to be due at least in part to the hardness of the $(Mg_xZn_{1-x})Al_2O_4$ and tetragonal $ZrO_2$ crystal phases contained therein.

In embodiments, the glass ceramic has a hardness of greater than or equal to about 9 GPa, such as greater than or equal to about 9.1 GPa, greater than or equal to about 9.2 GPa, greater than or equal to about 9.3 GPa, greater than or equal to about 9.4 GPa, greater than or equal to about 9.5 GPa, greater than or equal to about 9.6 GPa, greater than or equal to about 9.7 GPa, greater than or equal to about 9.8 GPa, greater than or equal to about 9.9 GPa, greater than or equal to about 10.0 GPa, greater than or equal to about 10.1 GPa, greater than or equal to about 10.2 GPa, greater than or equal to about 10.3 GPa, greater than or equal to about 10.4 GPa, greater than or equal to about 10.5 GPa, greater than or equal to about 10.6 GPa, greater than or equal to about 10.7 GPa, greater than or equal to about 10.8 GPa, greater than or equal to about 10.9 GPa, greater than or equal to about 11.0 GPa, or greater than or equal to about 11.1 GPa. It should be understood that, in embodiments, any of the above ranges may be combined with any other range. In embodiments, the glass ceramic has a hardness of greater than or equal to about 9.0 GPa to less than or equal to about 11.2 GPa, such as greater than or equal to about 9.1 GPa to less than or equal to about 11.1 GPa, greater than or equal to about 9.2 GPa to less than or equal to about 11.0 GPa, greater than or equal to about 9.3 GPa to less than or equal to about 10.9 GPa, greater than or equal to about 9.4 GPa to less than or equal to about 10.8 GPa, greater than or equal to about 9.5 GPa to less than or equal to about 10.7 GPa, greater than or equal to about 9.6 GPa to less than or equal to about 10.6 GPa, greater than or equal to about 9.7 GPa to less than or equal to about 10.5 GPa, greater than or equal to about 9.8 GPa to less than or equal to about 10.4 GPa, greater than or equal to about 9.9 GPa to less than or equal to about 10.3 GPa, or greater than or equal to about 10.0 GPa to less than or equal to about 10.2 GPa, and all ranges and sub-ranges between the foregoing values.

Glass ceramics according to embodiments may have a Young's modulus greater than or equal to about 98.0 GPa, such as greater than or equal to about 99.0 GPa, greater than or equal to about 100.0 GPa, greater than or equal to about 101.0 GPa, greater than or equal to about 102.0 GPa, greater than or equal to about 103.0 GPa, greater than or equal to about 104.0 GPa, greater than or equal to about 105.0 GPa, greater than or equal to about 106.0 GPa, greater than or equal to about 107.0 GPa, greater than or equal to about 108.0 GPa, greater than or equal to about 109.0 GPa, greater than or equal to about 110.0 GPa, greater than or equal to about 111.0 GPa, greater than or equal to about 112.0 GPa, or greater than or equal to about 113.0 GPa. It should be understood that, in embodiments, any of the above ranges may be combined with any other range. In embodiments, the glass ceramics have a Young's modulus from greater than or equal to about 98.0 GPa to less than or equal to about 114.0 GPa, such as from greater than or equal to about 99.0 GPa to less than or equal to about 113.0 GPa, from greater than or equal to about 100.0 GPa to less than or equal to about 112.0 GPa, from greater than or equal to about 101.0 GPa to less than or equal to about 111.0 GPa, from greater than or equal to about 102.0 GPa to less than or equal to about 110.0 GPa, from greater than or equal to about 103.0 GPa to less than or equal to about 109.0 GPa, from greater than or equal to about 104.0 GPa to less than or equal to about 108.0 GPa, or from greater than or equal to about 105.0 GPa to less than or equal to about 107.0 GPa, and all ranges and sub-ranges between the foregoing values. The Young's modulus values recited in this disclosure refer to a value as measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts," and are reported in GPa, unless otherwise specified.

The glass ceramic may have a strain point and an anneal point high enough to allow additional processing of the glass ceramic at temperatures of up to about 800° C. without detrimental effect on the structural integrity of the glass ceramic. This additional processing may include chemical strengthening, such as ion exchange. These elevated processing temperatures may increase the efficiency of additional processing, such as by reducing the time necessary for the additional processing. In embodiments, the strain point may be less than or equal to about 900° C., such as from greater than or equal to about 700° C. to less than or equal to about 900° C. These strain points allow for improved thermal stability and a larger potential temperature range for ion exchange treatments. If the strain point is too low, the additional processing of the glass ceramic may become difficult. If the strain point is too high, the manufacturing of the precursor glass compositions may become difficult.

The composition of the transparent gahnite-spinel glass ceramics will now be described. In embodiments of glass ceramics described herein, the concentration of constituent components (e.g., $SiO_2$, $Al_2O_3$, $Li_2O$, $Na_2O$ and the like) are given in mole percent (mol %) on an oxide basis, unless otherwise specified. Components of the glass ceramics according to embodiments are discussed individually below. It should be understood that any of the variously recited ranges of one component may be individually combined with any of the variously recited ranges for any other component.

In embodiments of the glass ceramics disclosed herein, $SiO_2$ is the largest constituent. Pure $SiO_2$ has a relatively low CTE and is alkali free. However, pure $SiO_2$ has a high melting point. Accordingly, if the concentration of $SiO_2$ in the glass ceramic is too high, the formability of the precursor glass composition used to form the glass ceramics may be diminished as higher concentrations of $SiO_2$ increase the difficulty of melting the glass, which, in turn, adversely impacts the formability of the precursor glass. In embodiments, the glass composition generally comprises $SiO_2$ in an amount greater than or equal to about 35.0 mol %, such as greater than or equal to about 40.0 mol %, greater than or equal to about 45.0 mol %, greater than or equal to about 50.0 mol %, greater than or equal to about 55.0 mol %, greater than or equal to about 60.0 mol %, or greater than or equal to about 65.0 mol %. In embodiments, the glass composition comprises $SiO_2$ in amounts less than or equal to about 70.0 mol %, less than or equal to about 65.0 mol %, less than or equal to about 60.0 mol %, less than or equal to about 55.0 mol %, less than or equal to about 50.0 mol %, less than or equal to about 45.0 mol %, less than or equal to about 40.0 mol %, or less than or equal to about 35.0 mol %. It should be understood that, in embodiments, any of the above ranges may be combined with any other range. In embodiments, the glass composition comprises $SiO_2$ in an amount from greater than or equal to about 35.0 mol % to less than or equal to about 70.0 mol %, from greater than or equal to about 40.0 mol % to less than or equal to about 65.0 mol %, from greater than or equal to about 45.0 mol % to less than or equal to about 60.0 mol %, or from greater than or equal to about 50.0 mol % to less than or equal to about 55.0 mol %, and all ranges and sub-ranges between the foregoing values. In one or more embodiments, the glass composition comprises $SiO_2$ in amounts from greater than or equal to about 35.0 mol % to less than or equal to about 60.0 mol %, and all ranges and sub-ranges between the foregoing values.

The glass ceramics of embodiments may further comprise $Al_2O_3$. $Al_2O_3$ may increase the viscosity of the precursor glass compositions used to form the glass ceramics due to its tetrahedral coordination in a glass melt formed from a glass composition, decreasing the formability of the glass composition when the amount of $Al_2O_3$ is too high. However, when the concentration of $Al_2O_3$ is balanced against the concentration of $SiO_2$ and the concentration of alkali oxides in the glass composition, $Al_2O_3$ can reduce the liquidus temperature of the glass melt, thereby enhancing the liquidus viscosity and improving the compatibility of the glass composition with certain forming processes, such as the fusion forming process. The $Al_2O_3$ in the precursor glass also supplies the aluminum necessary to form the gahnite-spinel crystal phase when the precursor glass is cerammed to form a glass ceramic. In embodiments, the glass composition generally comprises $Al_2O_3$ in a concentration of greater than or equal to about 13.0 mol %, such as greater than or equal to about 14.0 mol %, greater than or equal to about 15.0 mol %, greater than or equal to about 16.0 mol %, greater than or equal to about 17.0 mol %, greater than or equal to about 18.0 mol %, greater than or equal to about 19.0 mol %, greater than or equal to about 20.0 mol %, greater than or equal to about 21.0 mol %, greater than or equal to about 22.0 mol %, greater than or equal to about 23.0 mol %, greater than or equal to about 24.0 mol %, greater than or equal to about 25.0 mol %, greater than or equal to about 26.0 mol %, greater than or equal to about 27.0 mol %, or greater than or equal to about 28.0 mol %. In embodiments, the glass composition comprises $Al_2O_3$ in amounts less than or equal to about 30.0 mol %, less than or equal to about 29.0 mol %, less than or equal to about 28.0 mol %, less than or equal to about 27.0 mol %, less than or equal to about 26.0 mol %, less than or equal to about 27.0 mol %, less than or equal to about 26.0 mol %, less than or equal to about 25.0 mol %, less than or equal to about 24.0 mol %, less than or equal to about 23.0 mol %, less than or equal to about 22.0 mol %, less than or equal to about 21.0 mol %, less than or equal to about 20.0 mol %, less than or equal to about 19.0 mol %, less than or equal to about 18.0 mol %, less than or equal to about 17.0 mol %, less than or equal to about 16.0 mol %, less than or equal to about 15.0 mol %, or less than or equal to about 14.0 mol %. It should be understood that, in embodiments, any of the above ranges may be combined with any other range. In embodiments, the glass composition comprises $Al_2O_3$ in an amount from greater than or equal to about 13.0 mol % to less than or equal to about 30.0 mol %, such as from greater than or equal to about 14.0 mol % to less than or equal to about 29.0 mol %, from greater than or equal to about 15.0 mol % to less than or equal to about 28.0 mol %, from greater than or equal to about 16.0 mol % to less than or equal to about 27.0 mol %, from greater than or equal to about 17.0 mol % to less than or equal to about 26.0 mol %, from greater than or equal to about 18.0 mol % to less than or equal to about 25.0 mol %, from greater than or equal to about 19.0 mol % to less than or equal to about 24.0 mol %, from greater than or equal to about 20.0 mol % to less than or equal to about 23.0 mol %, or from greater than or equal to about 21.0 mol % to less than or equal to about 22.0 mol %, and all ranges and sub-ranges between the foregoing values.

The glass ceramics of embodiments may further comprise ZnO. The ZnO in the precursor glass supplies the zinc necessary to form the gahnite-spinel crystal phase when the precursor glass is cerammed to form a glass ceramic. In embodiments, the glass composition generally comprises ZnO in a concentration of greater than or equal to about 8.0 mol %, such as greater than or equal to about 9.0 mol %, greater than or equal to about 10.0 mol %, greater than or equal to about 11.0 mol %, greater than or equal to about 12.0 mol %, greater than or equal to about 13.0 mol %, greater than or equal to about 14.0 mol %, greater than or equal to about 15.0 mol %, or greater than or equal to about 16.0 mol %. In embodiments, the glass composition comprises ZnO in amounts less than or equal to about 20.0 mol %, less than or equal to about 19.0 mol %, less than or equal to about 18.0 mol %, less than or equal to about 17.0 mol %, less than or equal to about 16.0 mol %, less than or equal to about 17.0 mol %, less than or equal to about 16.0 mol %, less than or equal to about 15.0 mol %, less than or equal to about 14.0 mol %, less than or equal to about 13.0 mol %, less than or equal to about 12.0 mol %, less than or equal to about 11.0 mol %, less than or equal to about 10.0 mol %, or less than or equal to about 9.0 mol %. It should be understood that, in embodiments, any of the above ranges may be combined with any other range. In embodiments, the glass composition comprises ZnO in an amount from greater than or equal to about 8.0 mol % to less than or equal to about 20.0 mol %, such as from greater than or equal to about 9.0 mol % to less than or equal to about 19.0 mol %, from greater than or equal to about 10.0 mol % to less than or equal to about 18.0 mol %, from greater than or equal to about 11.0 mol % to less than or equal to about 17.0 mol %, from greater than or equal to about 12.0 mol % to less than or equal to about 16.0 mol %, or from greater than or equal to about 13.0 mol % to less than or equal to about 15.0 mol %, and all ranges and sub-ranges between the foregoing values.

The glass ceramics of embodiments may further comprise MgO. The MgO in the precursor glass supplies the magnesium necessary to form a spinel solid solution containing crystal phase when the precursor glass is cerammed to form a glass ceramic. In embodiments, the amount of MgO in the glass ceramic is greater than or equal to 0 mol %, such as greater than or equal to about 1.0 mol %, greater than or equal to about 2.0 mol %, greater than or equal to about 3.0 mol %, greater than or equal to about 4.0 mol %, greater than or equal to about 5.0 mol %, greater than or equal to about 6.0 mol %, or greater than or equal to about 7.0 mol %. In embodiments, the amount of MgO in the glass ceramic is less than or equal to about 8.0 mol %, such as less than or equal to about 7.0 mol %, less than or equal to about 6.0 mol %, less than or equal to about 5.0 mol %, less than or equal to about 4.0 mol %, less than or equal to about 3.0 mol %, less than or equal to about 2.0 mol %, or less than or equal to about 1.0 mol %. It should be understood that, in embodiments, any of the above ranges may be combined with any other range. In embodiments, the amount of MgO in the glass ceramic is greater than or equal to 0 mol % to less than or equal to about 8.0 mol %, such as greater than or equal to about 1.0 mol % to less than or equal to about 7.0 mol %, greater than or equal to about 2.0 mol % to less than or equal to about 6.0 mol %, or greater than or equal to about 3.0 mol % to less than or equal to about 5.0 mol %, and all ranges and sub-ranges between the foregoing values. In embodiments, the glass ceramic is substantially free or free of MgO. In embodiments where the ratio of MgO to ZnO is too high in the glass ceramic, the transparency of the glass ceramic is reduced.

The glass ceramics of embodiments may further comprise nucleating agents. The nucleating agents allow the glass ceramics to be transparent by reducing the crystallite size of the gahnite-spinel crystal phase. In some embodiments, the nucleating agents allow the glass ceramics to be cerammed without a separate nucleation step. The nucleating agents may be selected from $ZrO_2$, $TiO_2$, and $HfO_2$. When the total amount of nucleating agents is too low (e.g., less than about 5 mol %), the glass ceramics are opaque in the visible range due to less effective nucleation and increased gahnite-spinel crystallite size. In embodiments, the total amount of nucleating agents in the glass ceramic may be an amount greater than or equal to about 5.0 mol %, such as greater than or equal to about 6.0 mol %, greater than or equal to about 7.0 mol %, greater than or equal to about 8.0 mol %, greater than or equal to about 9.0 mol %, greater than or equal to about 10.0 mol %, greater than or equal to about 11.0 mol %, greater than or equal to about 12.0 mol %, greater than or equal to about 13.0 mol %, greater than or equal to about 14.0 mol %, or greater than or equal to about 15.0 mol %. In embodiments, the total amount of nucleating agents in the glass ceramic may be an amount less than or equal to about 16.0 mol %, such as less than or equal to about 15.0 mol %, less than or equal to about 14.0 mol %, less than or equal to about 13.0 mol %, less than or equal to about 12.0 mol %, less than or equal to about 11.0 mol %, less than or equal to about 10.0 mol %, less than or equal to about 9.0 mol %, less than or equal to about 8.0 mol %, less than or equal to about 7.0 mol %, or less than or equal to about 6.0 mol %. It should be understood that, in embodiments, any of the above ranges may be combined with any other range. In embodiments, the total amount of nucleating agents in the glass ceramic may be an amount from greater than or equal to about 5.0 mol % to less than or equal to about 16.0 mol %, such as an amount from greater than or equal to about 6.0 mol % to less than or equal to about 15.0 mol %, from greater than or equal to about 7.0 mol % to less than or equal to about 14.0 mol %, from greater than or equal to about 8.0 mol % to less than or equal to about 13.0 mol %, from greater than or equal to about 9.0 mol % to less than or equal to about 12.0 mol %, or from greater than or equal to about 10.0 mol % to less than or equal to about 11.0 mol %, and all ranges and sub-ranges between the foregoing values.

In embodiments, the glass ceramic may include $ZrO_2$ as the sole nucleating agent. In addition to acting as a nucleating agent, the presence of $ZrO_2$ in the precursor glass facilitates the crystallization of tetragonal $ZrO_2$ during the ceramming process. The use of $ZrO_2$ as the sole nucleating agent in the precursor glass compositions allows the production of glass ceramics that are colorless in appearance. In embodiments, the amount of $ZrO_2$ in the glass ceramic is greater than 0 mol %, such as greater than or equal to about 1.0 mol %, greater than or equal to about 2.0 mol %, greater than or equal to about 3.0 mol %, greater than or equal to about 4.0 mol %, greater than or equal to about 5.0 mol %, greater than or equal to about 6.0 mol %, greater than or equal to about 7.0 mol %, greater than or equal to about 8.0 mol %, or greater than or equal to about 9.0 mol %. It should be understood that, in embodiments, any of the above ranges may be combined with any other range. In embodiments, the amount of $ZrO_2$ in the glass ceramic is greater than 0 mol % to less than or equal to about 10.0 mol %, such as greater than or equal to about 1.0 mol % to less than or equal to about 9.0 mol %, greater than or equal to about 2.0 mol % to less than or equal to about 8.0 mol %, greater than or equal to about 3.0 mol % to less than or equal to about 7.0 mol %, or greater than or equal to about 4.0 mol % to less than or equal to about 6.0 mol %, and all ranges and sub-ranges between the foregoing values.

In embodiments, the glass ceramic may include $TiO_2$ as a nucleating agent. $TiO_2$ is an effective nucleating agent. However, when the amount of $TiO_2$ in the precursor glass is too high, the resulting glass ceramic may have an undesirable colored appearance. The glass ceramics that include $TiO_2$ may have a yellow or brown appearance even when transparent in the visible range. Without wishing to be bound by any particular theory, it is believed that the reduction of $Ti^{4+}$ to $Ti^{3+}$ produces the colored appearance of the glass ceramic. In embodiments, the amount of $TiO_2$ in the glass ceramic is greater than or equal to 0 mol %, such as greater than or equal to about 1.0 mol %, greater than or equal to about 2.0 mol %, greater than or equal to about 3.0 mol %, greater than or equal to about 4.0 mol %, or greater than or equal to about 5.0 mol. In embodiments, the amount of $TiO_2$ in the glass ceramic is less than or equal to about 6.0 mol %, such as less than or equal to about 5.0 mol %, less than or equal to about 4.0 mol %, less than or equal to about 3.0 mol %, less than or equal to about 2.0 mol %, or less than or equal to about 1.0 mol %. It should be understood that, in embodiments, any of the above ranges may be combined with any other range. In embodiments, the amount of $TiO_2$ in the glass ceramic is greater than or equal to 0 mol % to less than or equal to about 6.0 mol %, such as greater than or equal to about 1.0 mol % to less than or equal to about 5.0 mol %, or greater than or equal to about 2.0 mol % to less than or equal to about 4.0 mol %, and all ranges and sub-ranges between the foregoing values. In embodiments, the glass ceramic is substantially free or free of $TiO_2$.

In embodiments, the glass ceramic may include $HfO_2$ as a nucleating agent. In embodiments, the amount of $HfO_2$ in the glass ceramic is greater than or equal to 0 mol %, such as greater than or equal to about 1.0 mol %, greater than or equal to about 2.0 mol %, greater than or equal to about 3.0 mol %, greater than or equal to about 4.0 mol %, greater than or equal to about 5.0 mol %, greater than or equal to about 6.0 mol %, greater than or equal to about 7.0 mol %, greater than or equal to about 8.0 mol %, or greater than or equal to about 9.0 mol %. In embodiments, the amount of $HfO_2$ in the glass ceramic is less than or equal to about 10.0 mol %, such as less than or equal to about 9.0 mol %, less than or equal to about 8.0 mol %, less than or equal to about 7.0 mol %, less than or equal to about 6.0 mol %, less than or equal to about 5.0 mol %, less than or equal to about 4.0 mol %, less than or equal to about 3.0 mol %, less than or equal to about 2.0 mol %, or less than or equal to about 1.0 mol %. It should be understood that, in embodiments, any of the above ranges may be combined with any other range. In embodiments, the amount of $HfO_2$ in the glass ceramic is greater than or equal to 0 mol % to less than or equal to about 10.0 mol %, such as greater than or equal to about 1.0 mol % to less than or equal to about 9.0 mol %, greater than or equal to about 2.0 mol % to less than or equal to about 8.0 mol %, greater than or equal to about 3.0 mol % to less than or equal to about 7.0 mol %, or greater than or equal to about 4.0 mol % to less than or equal to about 6.0 mol %, and all ranges and sub-ranges between the foregoing values. In embodiments, the glass ceramic may be substantially free or free of $HfO_2$.

The glass ceramic may include one or more alkali metal oxides. The alkali metal oxides facilitate the chemical strengthening of the glass ceramic, such as through an ion exchange process. The sum of the alkali metal oxides (e.g., $Li_2O$, $Na_2O$, and $K_2O$ as well as other alkali metal oxides including $Cs_2O$ and $Rb_2O$) in the glass ceramic may be referred to as "$R_2O$", and $R_2O$ may be expressed in mol %. In some embodiments, the glass ceramic may include a mixture of alkali metal oxides, such as a combination of $Li_2O$ and $Na_2O$. a combination of $Na_2O$ and $K_2O$, a combination of $Li_2O$ and $K_2O$, or a combination of $Li_2O$, $Na_2O$, and $K_2O$. The inclusion of a mixture of alkali metal oxides in the glass ceramic may result in faster and more efficient ion exchange. Without wishing to be bound by any particular theory, it is believed that the alkali metal oxides segregate into the residual glass phase of the glass ceramic upon ceramming.

The addition of lithium in the glass ceramic allows for an ion exchange process and further reduces the softening point of the precursor glass composition. In embodiments, the glass composition generally comprises $Li_2O$ in an amount greater than or equal to 0.0 mol %, such as greater than or equal to about 0.5 mol %, greater than or equal to about 1.0 mol %, greater than or equal to about 1.5 mol %, greater than or equal to about 2.0 mol %, greater than or equal to about 2.5 mol %, greater than or equal to about 3.0 mol %, greater than or equal to about 3.5 mol %, greater than or equal to about 4.0 mol %, greater than or equal to about 4.5 mol %, greater than or equal to about 5.0 mol %, greater than or equal to about 5.5 mol %, greater than or equal to about 6.0 mol %, greater than or equal to about 6.5 mol %, greater than or equal to about 7.0 mol %, or greater than or equal to about 7.5 mol %. In some embodiments, the glass composition comprises $Li_2O$ in amounts less than or equal to about 8.0 mol %, such as less than or equal to about 7.5 mol %, less than or equal to about 7.0 mol %, less than or equal to about 6.5 mol %, less than or equal to about 6.0 mol %, less than or equal to about 5.5 mol %, less than or equal to about 5.0 mol %, less than or equal to about 4.5 mol %, less than or equal to about 4.0 mol %, less than or equal to about 3.5 mol %, less than or equal to about 3.0 mol %, less than or equal to about 2.5 mol %, less than or equal to about 2.0 mol %, less than or equal to about 1.5 mol %, less than or equal to about 1.0 mol %, or less than or equal to about 0.5 mol %. It should be understood that, in embodiments, any of the above ranges may be combined with any other range. In embodiments, the glass composition comprises $Li_2O$ in an amount from greater than or equal to 0.0 mol % to less than or equal to about 8.0 mol %, such as from greater than or equal to about 0.5 mol % to less than or equal to about 7.5 mol %, from greater than or equal to about 1.0 mol % to less than or equal to 7.0 mol %, from greater than or equal to about 1.5 mol % to less than or equal to about 6.5 mol %, from greater than or equal to about 2.0 mol % to less than or equal to about 6.0 mol %, from greater than or equal to about 2.5 mol % to less than or equal to about 5.5 mol %, from greater than or equal to about 3.0 mol % to less than or equal to 5.0 mol %, or from greater than or equal to about 3.5 mol % to less than or equal to about 4.5 mol %, and all ranges and sub-ranges between the foregoing values.

Like $Li_2O$, $Na_2O$ aids in the ion exchangeability of the glass ceramic, and also decreases the melting point of the precursor glass composition and improves formability of the precursor glass composition. In embodiments, the glass composition generally comprises $Na_2O$ in an amount greater than or equal to 0.0 mol %, such as greater than or equal to about 0.5 mol %, greater than or equal to about 1.0 mol %, greater than or equal to about 1.5 mol %, greater than or equal to about 2.0 mol %, greater than or equal to about 2.5 mol %, greater than or equal to about 3.0 mol %, greater than or equal to about 3.5 mol %, greater than or equal to about 4.0 mol %, greater than or equal to about 4.5 mol %, greater than or equal to about 5.0 mol %, greater than or equal to about 5.5 mol %, greater than or equal to about 6.0 mol %, greater than or equal to about 6.5 mol %, greater than or equal to about 7.0 mol %, greater than or equal to about 7.5 mol %, greater than or equal to about 8.0 mol %, greater than or equal to about 8.5 mol %, greater than or equal to about 9.0 mol %, or greater than or equal to about 9.5 mol %. In some embodiments, the glass composition comprises $Na_2O$ in amounts less than or equal to about 10.0 mol %, such as less than or equal to about 9.5 mol %, less than or equal to about 9.0 mol %, less than or equal to about 8.5 mol %, less than or equal to about 8.0 mol %, less than or equal to about 7.5 mol %, less than or equal to about 7.0 mol %, less than or equal to about 6.5 mol %, less than or equal to about 6.0 mol %, less than or equal to about 5.5 mol %, less than or equal to about 5.0 mol %, less than or equal to about 4.5 mol %, less than or equal to about 4.0 mol %, less than or equal to about 3.5 mol %, less than or equal to about 3.0 mol %, less than or equal to about 2.5 mol %, less than or equal to about 2.0 mol %, less than or equal to about 1.5 mol %, less than or equal to about 1.0 mol %, or less than or equal to about 0.5 mol %. It should be understood that, in embodiments, any of the above ranges may be combined with any other range. In embodiments, the glass composition comprises $Na_2O$ in an amount from greater than or equal to 0.0 mol % to less than or equal to about 10.0 mol %, such as from greater than or equal to about 0.5 mol % to less than or equal to about 9.5 mol %, from greater than or equal to about 1.0 mol % to less than or equal to 9.0 mol %, from greater than or equal to about 1.5 mol % to less than or equal to about 8.5 mol %, from greater than or equal to about 2.0 mol % to less than or equal to about 8.0 mol %, from greater than or equal to about 2.5 mol % to less than or equal to about 7.5 mol %, from greater than or equal to about 3.0 mol % to less than or equal to about 7.0 mol %, from greater than or equal to about 3.5 mol % to less than or equal to about 6.5 mol %, from greater than or equal to about 4.0 mol % to less than or equal to about 6.0 mol %, or from greater than or equal to about 4.5 mol % to less than or equal to about 5.5 mol %, and all ranges and sub-ranges between the foregoing values.

In embodiments, the glass ceramic may additionally include BaO. The inclusion of BaO in the glass ceramic increases the refractive index of the residual glass phase in the glass ceramic. The BaO may be added to the glass melt as both a carbonate and a nitrate to maintain the oxidization state of the system during melting, preventing the reduction of $Ti^{4+}$ to $Ti^{3+}$ when $TiO_2$ is present in the composition. The BaO may act to prevent undesirable coloration of the glass ceramics due to the presence of $TiO_2$.

In embodiments, the glass ceramic may optionally include one or more fining agents. In some embodiments, the fining agents may include, for example, tin oxide ($SnO_2$) and/or arsenic oxide. In embodiments, $SnO_2$ may be present in the glass composition in an amount less than or equal to 0.3 mol %, such as from greater than or equal to 0.0 mol % to less than or equal to 0.3 mol %, greater than or equal to 0.1 mol % to less than or equal to 0.2 mol %, and all ranges and sub-ranges between the foregoing values. In embodiments, arsenic oxide may be present in the glass ceramic in an amount from greater than or equal to 0.0 mol % to less than or equal to 0.1 mol %, and all ranges and sub-ranges between the foregoing values. In embodiments, arsenic oxide may also act as a bleaching agent. In embodiments, the glass ceramic may be free or substantially free of one or both of arsenic and antimony.

From the above, glass ceramics according to embodiments may be formed from precursor glass articles formed by any suitable method, such as slot forming, float forming, rolling processes, fusion forming processes, etc.

A precursor glass article may be characterized by the manner in which it is formed. For instance, where the precursor glass article may be characterized as float-formable (i.e., formed by a float process), down-drawable and, in particular, fusion-formable or slot-drawable (i.e., formed by a down draw process such as a fusion draw process or a slot draw process).

Some embodiments of the precursor glass articles described herein may be formed by a down-draw process. Down-draw processes produce glass articles having a uniform thickness that possess relatively pristine surfaces. Because the average flexural strength of the glass article is controlled by the amount and size of surface flaws, a pristine surface that has had minimal contact has a higher initial strength. In addition, down drawn glass articles have a very flat, smooth surface that can be used in its final application without costly grinding and polishing.

Some embodiments of the precursor glass articles may be described as fusion-formable (i.e., formable using a fusion draw process). The fusion process uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass article. The fusion draw method offers the advantage that, because the two glass films flowing over the channel fuse together, neither of the outside surfaces of the resulting glass article comes in contact with any part of the apparatus. Thus, the surface properties of the fusion drawn glass article are not affected by such contact.

Some embodiments of the precursor glass articles described herein may be formed by a slot draw process. The slot draw process is distinct from the fusion draw method. In slot draw processes, the molten raw material glass is provided to a drawing tank. The bottom of the drawing tank has an open slot with a nozzle that extends the length of the slot. The molten glass flows through the slot/nozzle and is drawn downward as a continuous glass article and into an annealing region.

The glass ceramics may be formed by ceramming a precursor glass under any suitable conditions. The ceramming does not necessarily include a separate nucleation treatment for the purposes of forming crystal nuclei in the precursor glass. The ability to produce the transparent glass ceramics without a separate nucleation step reduces the complexities of the production process, and results in energy and time savings. In some embodiments, the inclusion of a nucleation treatment may allow additional control of the produced crystallite size.

In embodiments, the ceramming occurs at temperatures of greater than or equal to about 750° C., such as greater than or equal to about 800° C., greater than or equal to about 850° C., greater than or equal to about 900° C., greater than or equal to about 950° C., greater than or equal to about 1000° C., greater than or equal to about 1050° C., greater than or equal to about 1100° C., or more. In embodiments, the ceramming occurs at temperatures of from greater than or equal to about 750° C. to less than or equal to about 1100° C., such as greater than or equal to about 800° C. to less than or equal to about 1050° C., greater than or equal to about 850° C. to less than or equal to about 1000° C., or greater than or equal to about 900° C. to less than or equal to about 950° C., and all ranges and sub-ranges between the foregoing values.

In embodiments, the ceramming extends for a time period of greater than or equal to about 30 minutes, such as greater than or equal to about 1.0 hour, greater than or equal to about 1.5 hours, greater than or equal to about 2.0 hours, greater than or equal to about 2.5 hours, greater than or equal to about 3.0 hours, greater than or equal to about 3.5 hours, greater than or equal to about 4.0 hours, greater than or equal to about 4.5 hours, greater than or equal to about 5.0 hours, greater than or equal to about 5.5 hours, greater than or equal to about 6.0 hours, greater than or equal to about 6.5 hours, greater than or equal to about 7.0 hours, greater than or equal to about 7.5 hours, greater than or equal to about 8.0 hours, greater than or equal to about 8.5 hours, greater than or equal to about 9.0 hours, greater than or equal to about 9.5 hours, greater than or equal to about 10.0 hours, greater than or equal to about 10.5 hours, greater than or equal to about 11.0 hours, greater than or equal to about 11.5 hours, greater than or equal to about 12.0 hours, greater than or equal to about 12.5 hours, greater than or equal to about 13.0 hours, greater than or equal to about 13.5 hours, greater than or equal to about 14.0 hours, greater than or equal to about 14.5 hours, greater than or equal to about 15.0 hours, greater than or equal to about 15.5 hours, greater than or equal to about 16.0 hours, greater than or equal to about 16.5 hours, greater than or equal to about 17.0 hours, greater than or equal to about 17.5 hours, greater than or equal to about 18.0 hours, greater than or equal to about 18.5 hours, greater than or equal to about 19.0 hours, greater than or equal to about 19.5 hours, greater than or equal to about 20.0 hours, greater than or equal to about 20.5 hours, greater than or equal to about 21.0 hours, greater than or equal to about 21.5 hours, greater than or equal to about 22.0 hours, greater than or equal to about 22.5 hours, greater than or equal to about 23.0 hours, or greater than or equal to about 23.5 hours. In embodiments, the ceramming extends for a time period from greater than or equal to about 30 minutes to less than or equal to about 24.0 hours, such as greater than or equal to about 1.0 hour to less than or equal to about 23.0 hours, greater than or equal to about 1.5 hours to less than or equal to about 22.0 hours, greater than or equal to about 2.0 hours to less than or equal to about 21.0 hours, greater than or equal to about 2.5 hours to less than or equal to about 20.0 hours, greater than or equal to about 3.0 hours to less than or equal to about 19.0 hours, greater than or equal to about 3.5 hours to less than or equal to about 18.0 hours, greater than or equal to about 4.0 hours to less than or equal to about 17.0 hours, greater than or equal to about 4.5 hours to less than or equal to about 16.0 hours, greater than or equal to about 5.0 hours to less than or equal to about 15.0 hours, greater than or equal to about 5.5 hours to less than or equal to about 14.0 hours, greater than or equal to about 6.0 hours to less than or equal to about 13.0 hours, greater than or equal to about 6.5 hours to less than or equal to about 12.0 hours, greater than or equal to about 7.0 hours to less than or equal to about 11.0 hours, greater than or equal to about 7.5 hours to less than or equal to about 10.0 hours, or greater than or equal to about 8.0 hours to less than or equal to about 9.0 hours, and all ranges and sub-ranges between the foregoing values.

In embodiments containing a nucleation treatment, the nucleation treatment occurs at temperatures of greater than or equal to about 700° C., such as greater than or equal to about 750° C., greater than or equal to about 800° C., greater than or equal to about 850° C., greater than or equal to about 900° C., greater than or equal to about 950° C., or greater than or equal to about 1000° C., or more. In embodiments, the nucleation treatment occurs at temperatures of from greater than or equal to about 700° C. to less than or equal to about 1000° C., such as greater than or equal to about 750° C. to less than or equal to about 950° C., or greater than or equal to about 800° C. to less than or equal to about 900° C., and all ranges and sub-ranges between the foregoing values.

In embodiments, the nucleation treatment extends for a time period of greater than 0 minutes, such as greater than or equal to about 30 minutes, greater than or equal to about 1.0 hour, greater than or equal to about 1.5 hours, greater than or equal to about 2.0 hours, greater than or equal to about 2.5 hours, greater than or equal to about 3.0 hours, greater than or equal to about 3.5 hours, greater than or equal to about 4.0 hours, or more. In embodiments, the ceramming extends for a time period from greater than or equal to about 30 minutes to less than or equal to about 4.0 hours, such as greater than or equal to about 1.0 hour to less than or equal to about 3.5 hours, or greater than or equal to about 1.5 hours to less than or equal to about 3.0 hours, and all ranges and sub-ranges between the foregoing values.

In embodiments, the glass ceramics are also chemically strengthened, such as by ion exchange, making a glass ceramic that is damage resistant for applications such as, but not limited to, display covers. With reference to FIG. 1, the glass ceramic has a first region under compressive stress (e.g., first and second compressive layers 120, 122 in FIG. 1) extending from the surface to a depth of compression (DOC) of the glass ceramic and a second region (e.g., central region 130 in FIG. 1) under a tensile stress or central tension (CT) extending from the DOC into the central or interior region of the glass ceramic. As used herein, DOC refers to the depth at which the stress within the glass ceramic changes from compressive to tensile. At the DOC, the stress crosses from a positive (compressive) stress to a negative (tensile) stress and thus exhibits a stress value of zero.

According to the convention normally used in the art, compression or compressive stress is expressed as a negative (<0) stress and tension or tensile stress is expressed as a positive (>0) stress. Throughout this description, however, CS is expressed as a positive or absolute value—i.e., as recited herein, $CS=|CS|$. The compressive stress (CS) may have a maximum at the surface of the glass, and the CS may vary with distance d from the surface according to a function. Referring again to FIG. 1, a first compressive layer 120 extends from first surface 110 to a depth $d_1$ and a second compressive layer 122 extends from second surface 112 to a depth $d_2$. Together, these segments define a compression or CS of the glass ceramic 100. Compressive stress (including surface CS) is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety.

The compressive stress of both compressive stress regions (120, 122 in FIG. 1) is balanced by stored tension in the central region (130) of the glass. The maximum central tension (CT) and DOC values are measured using a scattered light polariscope (SCALP) technique known in the art.

Compressive stress layers may be formed in the glass by exposing the glass to an ion exchange solution. In embodiments, the ion exchange solution may be molten nitrate salt. In some embodiments, the ion exchange solution may be molten $KNO_3$, molten $NaNO_3$, or combinations thereof. In certain embodiments, the ion exchange solution may comprise less than or equal to about 100% molten $KNO_3$, such as less than or equal to about 95% molten $KNO_3$, less than or equal to about 90% molten $KNO_3$, less than or equal to about 80% molten $KNO_3$, less than or equal to about 75% molten $KNO_3$, less than or equal to about 70% molten $KNO_3$, less than or equal to about 65% molten $KNO_3$, less than or equal to about 60% molten $KNO_3$, or less. In certain embodiments, the ion exchange solution may comprise greater than or equal to about 10% molten $NaNO_3$, such as greater than or equal to about 15% molten $NaNO_3$, greater than or equal to about 20% molten $NaNO_3$, greater than or equal to about 25% molten $NaNO_3$, greater than or equal to about 30% molten $NaNO_3$, greater than or equal to about 35% molten $NaNO_3$, greater than or equal to about 40% molten $NaNO_3$, or more. In other embodiments, the ion exchange solution may comprise about 80% molten $KNO_3$ and about 20% molten $NaNO_3$, about 75% molten $KNO_3$ and about 25% molten $NaNO_3$, about 70% molten $KNO_3$ and about 30% molten $NaNO_3$, about 65% molten $KNO_3$ and about 35% molten $NaNO_3$, or about 60% molten $KNO_3$ and about 40% molten $NaNO_3$, and all ranges and sub-ranges between the foregoing values. In embodiments, other sodium and potassium salts may be used in the ion exchange solution, such as, for example sodium or potassium nitrites, phosphates, or sulfates. In embodiments, the ion exchange solution may include silicic acid, such as less than or equal to about 1 wt % silicic acid.

The glass ceramic may be exposed to the ion exchange solution by dipping the glass ceramic into a bath of the ion exchange solution, spraying the ion exchange solution onto the glass ceramic, or otherwise physically applying the ion exchange solution to the glass ceramic. Upon exposure to the glass ceramic, the ion exchange solution may, according to embodiments, be at a temperature from greater than or equal to 400° C. to less than or equal to 500° C., such as from greater than or equal to 410° C. to less than or equal to 490° C., from greater than or equal to 420° C. to less than or equal to 480° C., from greater than or equal to 430° C. to less than or equal to 470° C., or from greater than or equal to 440° C. to less than or equal to 460° C., and all ranges and sub-ranges between the foregoing values. In embodiments, the glass ceramic may be exposed to the ion exchange solution for a duration from greater than or equal to 4 hours to less than or equal to 48 hours, such as from greater than or equal to 8 hours to less than or equal to 44 hours, from greater than or equal to 12 hours to less than or equal to 40 hours, from greater than or equal to 16 hours to less than or equal to 36 hours, from greater than or equal to 20 hours to less than or equal to 32 hours, or from greater than or equal to 24 hours to less than or equal to 28 hours, and all ranges and sub-ranges between the foregoing values.

The ion exchange process may be performed in an ion exchange solution under processing conditions that provide an improved compressive stress profile as disclosed, for example, in U.S. Patent Application Publication No. 2016/0102011, which is incorporated herein by reference in its entirety.

After an ion exchange process is performed, it should be understood that a composition at the surface of the glass ceramic may be different than the composition of the as-formed glass ceramic (i.e., the glass ceramic before it undergoes an ion exchange process). This results from one type of alkali metal ion in the as-formed glass, such as, for example $Li^+$ or $Na^+$, being replaced with larger alkali metal ions, such as, for example $Na^+$ or $K^+$, respectively. However, the composition of the glass ceramic at or near the center of the depth of the glass article will, in embodiments, still have the composition of the as-formed glass ceramic.

Figure 2B:
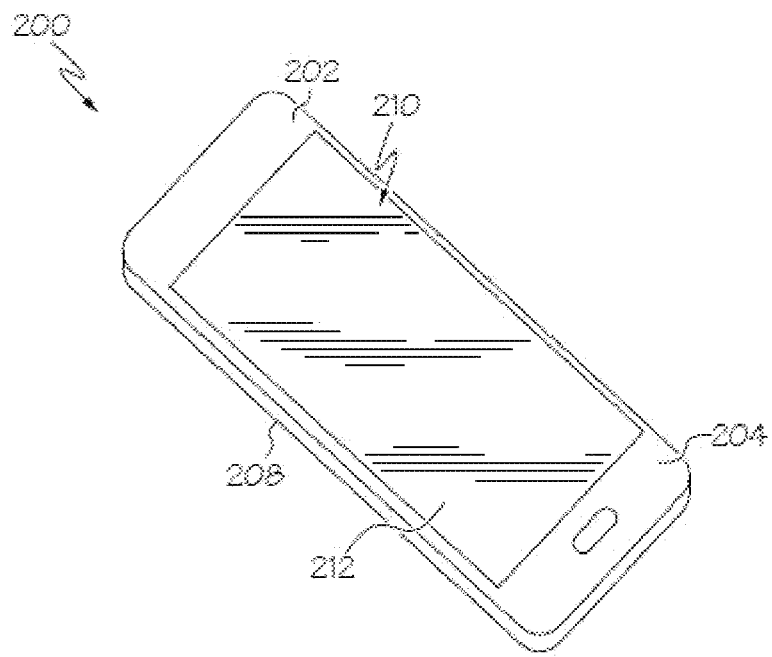
FIG. 2B is a perspective view of the exemplary electronic device of FIG. 2A.

The glass ceramic articles disclosed herein may be incorporated into another article such as an article with a display (or display articles) (e.g., consumer electronics, including mobile phones, tablets, computers, navigation systems, and the like), architectural articles, transportation articles (e.g., automobiles, trains, aircraft, sea craft, etc.), appliance articles, or any article that requires some transparency, scratch-resistance, abrasion resistance or a combination thereof. An exemplary article incorporating any of the glass ceramic articles disclosed herein is shown in FIGS. 2A and 2B. Specifically, FIGS. 2A and 2B show a consumer electronic device 200 including a housing 202 having front 204, back 206, and side surfaces 208; electrical components (not shown) that are at least partially inside or entirely within the housing and including at least a controller, a memory, and a display 210 at or adjacent to the front surface of the housing; and a cover substrate 212 at or over the front surface of the housing such that it is over the display. In some embodiments, at least a portion of at least one of the cover substrate 212 and/or the housing 202 may include any of the glass articles disclosed herein.

EXAMPLES

Embodiments will be further clarified by the following examples. It should be understood that these examples are not limiting to the embodiments described above.

Glass ceramics having components listed in Table 1 below were prepared and cerammed according to the indicated ceram schedules. The details of the ceram schedules are provided in Table 2 below. In Table 1, all components are in mol %, and various properties of the glass compositions were measured according to the methods described herein.

The phase assemblage was determined based on x-ray diffraction (XRD) analysis. The amount of the residual glass, gahnite, and tetragonal $ZrO_2$ phases present in the glass ceramic, in wt %, were measured using Rietveld quantitative analysis. The density values refer to a value as measured by the buoyancy method of ASTM C693-93 (2013). The hardness was measured with a nanoindenter, as described above. The Young's modulus was measured by a resonant ultrasonic spectroscopy technique of the general type set forth in ASTM E2001-13, titled "Standard Guide for Resonant Ultrasound Spectroscopy for Defect Detection in

TABLE 1

| mol % | A | B | C | D | E | F | G | H |
|---|---|---|---|---|---|---|---|---|
| $SiO_2$ | 66.2 | 54.2 | 55.0 | 54.1 | 53.8 | 53.7 | 53.8 | 46.8 |
| $Al_2O_3$ | 13.7 | 18.6 | 18.8 | 19.2 | 19.1 | 20.3 | 20.5 | 24.1 |
| ZnO | 8.6 | 11.3 | 10.0 | 10.4 | 10.5 | 10.7 | 10.3 | 10.3 |
| MgO | 4.6 | 6.3 | 5.7 | 5.9 | 5.8 | 5.9 | 5.9 | 5.8 |
| BaO | 1.0 | 1.4 | 1.2 | 1.2 | 1.2 | 1.2 | 1.2 | 1.2 |
| $TiO_2$ | 4.1 | 5.9 | 4.0 | 4.0 | 4.1 | 2.1 | 2.2 | 2.1 |
| $ZrO_2$ | 1.7 | 2.3 | 3.6 | 3.5 | 3.4 | 3.4 | 1.6 | 3.5 |
| $Na_2O$ | 0.1 | 0.1 | 1.8 | 0.9 | 0.1 | 2.6 | 2.7 | 6.2 |
| $Li_2O$ | | | | 1.0 | 1.9 | | | |
| $HfO_2$ | | | | | | | 1.8 | |
| $As_2O_5$ | | | 0.02 | 0.03 | 0.03 | 0.03 | 0.05 | 0.03 |
| $SnO_2$ | | | | | | | | |
| Ceram Schedule | A | A | B | B | C | B | B | B |
| Phase Assemblage | T, G | T, G | T, G | T, G | T, G | T, G | T, G | T, G |
| Glass (wt %) | 74 | 60 | 63 | 62 | 66 | 61 | 57 | 51 |
| Gahnite (wt %) | 25 | 39 | 33 | 35 | 30 | 33 | 36 | 42 |
| Tet. $ZrO_2$ (wt %) | 0.9 | 1.6 | 4.8 | 4.0 | 4.5 | 5.2 | 7.2 | 6.3 |
| Density (g/cm³) | 2.792 | 3.054 | | 3.017 | | | 3.055 | 3.049 |
| Hardness (GPa) | 10.3 | 11.1 | 10.0 | 10.3 | 10.3 | 9.8 | | |
| Young's Modulus (GPa) | 98.3 | 113.1 | 108.1 | 111 | 111.1 | 106.2 | | 105.8 |
| Anneal Point (° C.) | | | 906.4 | 877.5 | 855.8 | 890.8 | | |
| Strain Point (° C.) | | | 841.6 | 812.6 | 792.1 | 824.9 | | |

| mol % | I | J | K | L |
|---|---|---|---|---|
| $SiO_2$ | 46.6 | 46.1 | 53.4 | 43.0 |
| $Al_2O_3$ | 24.0 | 23.9 | 21.2 | 28.5 |
| ZnO | 10.2 | 10.3 | 10.4 | 11.1 |
| MgO | 5.8 | 5.8 | 5.8 | 3.1 |
| BaO | 1.2 | 1.2 | 1.2 | 2.5 |
| $TiO_2$ | 2.1 | 2.1 | | |
| $ZrO_2$ | 3.5 | 3.5 | 4.4 | 7.8 |
| $Na_2O$ | 3.1 | 0.1 | 3.6 | 3.0 |
| $Li_2O$ | 3.4 | 6.9 | | 1.0 |
| $HfO_2$ | | | | |
| $As_2O_5$ | 0.03 | 0.03 | 0.03 | |
| $SnO_2$ | | | | 0.2 |
| Ceram Schedule | B | B | D | D |
| Phase Assemblage | T, G, B | | T, G | T, G |
| Glass (wt %) | 47 | | 60 | |
| Gahnite (wt %) | 41 | | 33 | |
| Tet. $ZrO_2$ (wt %) | 6.0 | | 6.9 | |
| Density (g/cm³) | | | 3.019 | |

Both Metallic and Non-metallic Parts." The annealing point and the strain point were determined using the beam bending viscosity method of ASTM C598-93 (2013).

TABLE 2

| Ceram Schedule | Conditions |
|---|---|
| A | 800° C. for 2 hrs |
|   | 1000° C. for 4 hrs |
| B | 1000° C. for 4 hrs |
| C | 825° C. for 4 hrs |
| D | 950° C. for 4 hrs |
| E | 850° C. for 4 hrs |
| F | 800° C. for 2 hrs |
|   | 1050° C. for 4 hrs |
| G | 800° C. for 2 hrs |
|   | 950° C. for 4 hrs |
| H | 800° C. for 4 hrs |
| I | 900° C. for 4 hrs |
| J | 800° C. for 2 hrs |
|   | 1100° C. for 4 hrs |
| K | 800° C. for 2 hrs |
|   | 900° C. for 4 hrs |
| L | 800° C. for 2 hrs |
|   | 1000° C. for 4 hrs |
|   | Slow Cool |
| N | Slow Ramp 1 |
|   | 950° C. for 4 hrs |
| O | Slow Ramp 1 |
|   | 850° C. for 4 hrs |
| P | 895° C. for 4 hrs |
| Q | Slow Ramp 1 |
|   | 900° C. for 4 hrs |
| R | 800° C. for 2 hrs |
|   | 900° C. for 4 hrs |
|   | Slow Cool |
| S | 990° C. for 4 hrs |
| X | 1050° C. for 4 hrs |
| Y | Slow Ramp 2 |
|   | 950° C. for 4 hrs |
| Z | Slow Ramp 1 |
|   | 1100° C. for 4 hrs |
| AA | Slow Ramp 1 |
|   | 950° C. for 2 hrs |
| AB | Slow Ramp 1 |
|   | 950° C. for 24 hrs |

Unless otherwise indicated, the ceram schedules included heating the precursor glass in a furnace from room temperature at a ramp rate of 5° C./min to the indicated treatment condition, holding for the indicated time, and then the furnace was allowed to cool to ambient temperature. Where the ceram schedule indicates two treatment temperatures and times, the first treatment time and temperature correspond to a nucleation treatment and the second treatment time and temperature correspond to a ceramming treatment, with the ramp rate between the two treatment conditions being 5° C./min. The ceram schedules that indicate the Slow Ramp 1 condition included heating the precursor glass in a furnace from room temperature at a ramp rate of 5° C./min to 700° C. and then at a ramp rate of 1° C./min to the indicated treatment condition. The ceram schedules that indicate the Slow Ramp 2 condition included heating the precursor glass in a furnace from room temperature at a ramp rate of 5° C./min to 700° C. and then at a ramp rate of 0.5° C./min to the indicated treatment condition. The ceram schedules that indicate the Slow Cool condition included decreasing from 1000° C. to 900° C. over a period of 5 hours, decreasing from 900° C. to 800° C. over a period of 3 hours and 10 minutes, decreasing from 800° C. to 700° C. over a period of 2 hours, and decreasing from 700° C. to room temperature over a period of 15 minutes.

The phases detected in the phase assemblage determination are described in Table 3 below.

TABLE 3

| | Phase |
|---|---|
| T | tetragonal $ZrO_2$ |
| G | gahnite |
| B | β-spodumene |
| V | virgilite |
| Q | quartz |
| S | srilankite |
| C | cristobalite |
| R | rutile |
| M | Mg—Al—Ti—O |
| M2 | $Mg_2TiO_4$ |
| P | petalite |
| B2 | benitoite |
| B3 | baddeleyite |

Additional precursor glasses having compositions as listed in Table 4 below were prepared. In Table 4, all components are in mol %, and the reported properties are of the precursor glass compositions.

TABLE 4

| Analyzed (mol %) | 1 | 2 | 3 | 4 | 5 | 6 | 7 | 8 |
|---|---|---|---|---|---|---|---|---|
| $SiO_2$ | 66.0 | 63.8 | 62.3 | 57.9 | 56.4 | 54.0 | 60.6 | 60.4 |
| $Al_2O_3$ | 13.7 | 14.4 | 15.3 | 17.0 | 17.8 | 18.6 | 16.2 | 16.0 |
| ZnO | 8.6 | 9.0 | 9.5 | 10.6 | 10.6 | 11.2 | 9.6 | 9.5 |
| MgO | 4.6 | 5.0 | 5.2 | 5.8 | 6.0 | 6.2 | 5.3 | 5.4 |
| $ZrO_2$ | 1.7 | 1.8 | 1.9 | 2.1 | 2.2 | 2.3 | 2.0 | 5.2 |
| $TiO_2$ | 4.1 | 4.6 | 4.3 | 4.9 | 5.4 | 5.9 | 4.8 | 1.9 |
| $Li_2O$ | | | | | | | | |
| $Na_2O$ | | | | | | | | |
| $K_2O$ | | | | | | | | |
| BaO | 1.0 | 1.0 | 1.1 | 1.2 | 1.3 | 1.4 | 1.1 | 1.2 |
| $As_2O_5$ | | | | | | | | |
| $NO_2$ | 0.2 | 0.2 | 0.2 | 0.2 | 0.2 | 0.2 | 0.2 | 0.2 |
| $SnO_2$ | | | | | | | | |
| $B_2O_3$ | | | | | | | | |
| CaO | | | | | | | | |
| $Ce_2O$ | | | | | | | | |
| $GeO_2$ | | | | | | | | |
| $HfO_2$ | | | | | | | | |
| $La_2O_3$ | | | | | | | | |
| MnO | | | | | | | | |
| $P_2O_5$ | | | | | | | | |
| NiO | | | | | | | | |

TABLE 4-continued

| | | | | | | | | |
|---|---|---|---|---|---|---|---|---|
| Co₃O₄ | | | | | | | | |
| SrO | | | | | | | | |
| Ta₂O₅ | | | | | | | | |
| ZrO₂ + TiO₂ | 5.8 | 6.4 | 6.2 | 7.0 | 7.6 | 8.2 | 6.8 | 7.1 |

| | 1 | 2 | 3 | 4 | 5 | 6 | 7 | 8 |
|---|---|---|---|---|---|---|---|---|
| Density (g/cm³) | 2.706 | 2.745 | 2.794 | 2.871 | 2.923 | 2.938 | 2.864 | 2.887 |
| Poisson's Ratio | 0.235 | | 0.244 | | | 0.258 | | |
| Shear Modulus (GPa) | 37.51 | | 38.47 | | | 40.82 | | |
| Young's Modulus (GPa) | 92.67 | | 95.77 | | | 102.80 | | |
| Liquidus - Air (24 hrs, ° C.) | 1410 | | | 1460 | | 1470 | 1450 | |
| Liquidus - Internal (24 hrs, ° C.) | 1405 | | | 1455 | | 1470 | 1440 | |
| Liquidus - Platinum (24 hrs, ° C.) | 1400 | | | 1450 | | 1470 | 1440 | |
| Liquidus - Primary Phase | Mullite | | | Mullite | | Mullite | Mullite | |
| Liquidus - Secondary Phase | Gahnite | | | Gahnite | | | Gahnite | |
| Anneal Point (° C.) | | | | | | | | |
| Strain Point (° C.) | | | | | | | | |
| RI @589.3 | | | | | | | | |

| Analyzed (mol %) | 9 | 10 | 11 | 12 | 13 | 14 | 15 | 16 |
|---|---|---|---|---|---|---|---|---|
| SiO₂ | 59.8 | 67.8 | 55.5 | 55.6 | 53.5 | 53.5 | 54.1 | 53.5 |
| Al₂O₃ | 16.1 | 12.9 | 17.9 | 18.0 | 19.3 | 19.4 | 18.8 | 20.5 |
| ZnO | 9.7 | 7.8 | 10.7 | 10.7 | 10.5 | 10.3 | 10.1 | 10.4 |
| MgO | 5.4 | 4.4 | 6.0 | 6.0 | 5.8 | 5.8 | 5.8 | 5.9 |
| ZrO₂ | 2.0 | 1.6 | 3.0 | 3.6 | 3.4 | 3.4 | 3.5 | 3.4 |
| TiO₂ | 5.2 | 4.2 | 5.0 | 4.4 | 4.1 | 4.2 | 4.1 | 2.2 |
| Li₂O | | | | | | 1.0 | 1.9 | |
| Na₂O | | | | | 1.7 | 0.9 | 0.1 | 2.6 |
| K₂O | | | | | | | | |
| BaO | 1.1 | 0.9 | 1.3 | 1.3 | 1.2 | 1.2 | 1.2 | 1.2 |
| As₂O₅ | | 0.1 | 0.1 | 0.1 | 0.1 | 0.1 | 0.1 | 0.1 |
| NO₂ | 0.2 | 0.2 | 0.2 | 0.2 | 0.2 | 0.2 | 0.2 | 0.2 |
| SnO₂ | 0.3 | | | | | | | |
| B₂O₃ | | | | | | | | |
| CaO | | | | | | | | |
| Ce₂O | | | | | | | | |
| GeO₂ | | | | | | | | |
| HfO₂ | | | | | | | | |
| La₂O₃ | | | | | | | | |
| MnO | | | | | | | | |
| P₂O₅ | | | | | | | | |
| NiO | | | | | | | | |
| Co₃O₄ | | | | | | | | |
| SrO | | | | | | | | |
| Ta₂O₅ | | | | | | | | |
| ZrO₂ + TiO₂ | 7.2 | 5.8 | 8.0 | 7.9 | 7.5 | 7.5 | 7.6 | 5.6 |

| | 9 | 10 | 11 | 12 | 13 | 14 | 15 | 16 |
|---|---|---|---|---|---|---|---|---|
| Density (g/cm³) | 2.8 | 2.689 | 2.914 | 2.922 | 2.913 | 2.914 | 2.917 | 2.894 |
| Poisson's Ratio | | 0.228 | | | 0.257 | 0.258 | 0.259 | |
| Shear Modulus (GPa) | | 36.89 | | | 40.06 | 40.82 | 41.02 | |
| Young's Modulus (GPa) | | 90.67 | | | 100.73 | 102.59 | 103.28 | |

TABLE 4-continued

| | | | | | | | | |
|---|---|---|---|---|---|---|---|---|
| Liquidus - Air (24 hrs, ° C.) | | | | | | | | |
| Liquidus - Internal (24 hrs, ° C.) | | | | | | | | |
| Liquidus - Platinum (24 hrs, ° C.) | | | | | | | | |
| Liquidus - Primary Phase | | | | | | | | |
| Liquidus - Secondary Phase | | | | | | | | |
| Anneal Point (° C.) | | | | | | | | |
| Strain Point (° C.) | | | | | | | | |
| RI @589.3 | | | | | | | | 1.591 |

| Analyzed (mol %) | 17 | 18 | 19 | 20 | 21 | 22 | 23 | 24 |
|---|---|---|---|---|---|---|---|---|
| $SiO_2$ | 51.9 | 52.0 | 51.9 | 50.2 | 50.1 | 50.0 | 53.9 | 54.1 |
| $Al_2O_3$ | 20.3 | 20.2 | 20.1 | 21.2 | 21.1 | 21.0 | 20.4 | 20.5 |
| ZnO | 10.3 | 10.2 | 10.2 | 10.2 | 10.2 | 10.1 | 10.4 | 16.1 |
| MgO | 5.8 | 5.8 | 5.8 | 5.8 | 5.8 | 5.8 | 5.8 | |
| $ZrO_2$ | 3.3 | 3.3 | 3.3 | 3.3 | 3.3 | 3.4 | 3.0 | 2.9 |
| $TiO_2$ | 4.2 | 4.1 | 4.1 | 4.2 | 4.1 | 4.1 | 2.2 | 2.2 |
| $Li_2O$ | | 1.5 | 2.9 | | 2.0 | 3.9 | | |
| $Na_2O$ | 2.6 | 1.3 | 0.1 | 3.5 | 1.8 | 0.1 | 2.6 | 2.7 |
| $K_2O$ | | | | | | | | |
| BaO | 1.2 | 1.2 | 1.2 | 1.2 | 1.2 | 1.2 | 1.2 | 1.2 |
| $As_2O_5$ | 0.1 | 0.1 | 0.1 | 0.1 | 0.1 | 0.1 | 0.1 | 0.1 |
| $NO_2$ | 0.2 | 0.2 | 0.2 | 0.2 | 0.2 | 0.2 | 0.2 | 0.2 |
| $SnO_2$ | | | | | | | | |
| $B_2O_3$ | | | | | | | | |
| CaO | | | | | | | | |
| $Ce_2O$ | | | | | | | | |
| $GeO_2$ | | | | | | | | |
| $HfO_2$ | | | | | | | | |
| $La_2O_3$ | | | | | | | | |
| MnO | | | | | | | | |
| $P_2O_5$ | | | | | | | | |
| NiO | | | | | | | | |
| $Co_3O_4$ | | | | | | | | |
| SrO | | | | | | | | |
| $Ta_2O_5$ | | | | | | | | |
| $ZrO_2 + TiO_2$ | 7.4 | 7.4 | 7.4 | 7.5 | 7.5 | 7.5 | 5.2 | 5.0 |

| | 17 | 18 | 19 | 20 | 21 | 22 | 23 | 24 |
|---|---|---|---|---|---|---|---|---|
| Density (g/cm³) | 2.921 | 2.916 | 2.923 | 2.942 | 2.932 | 2.934 | 2.880 | 2.953 |
| Poisson's Ratio | 0.259 | | | 0.234 | | | 0.254 | 0.258 |
| Shear Modulus (GPa) | 39.99 | | | 41.30 | | | 39.51 | 38.61 |
| Young's Modulus (GPa) | 100.73 | | | 101.90 | | | 99.08 | 97.08 |
| Liquidus - Air (24 hrs, ° C.) | | | | | | | | |
| Liquidus - Internal (24 hrs, ° C.) | | | | | | | | |
| Liquidus - Platinum (24 hrs, ° C.) | | | | | | | | |
| Liquidus - Primary Phase | | | | | | | | |
| Liquidus - Secondary Phase | | | | | | | | |
| Anneal Point (° C.) | | | | | | | | |

TABLE 4-continued

| | | | | | | | | |
|---|---|---|---|---|---|---|---|---|
| Strain Point (° C.) | | | | | | | | |
| RI @589.3 | 1.6042 | 1.6060 | 1.6094 | 1.6090 | 1.6127 | | 1.5882 | 1.5929 |

| Analyzed (mol %) | 25 | 26 | 27 | 28 | 29 | 30 | 31 | 32 |
|---|---|---|---|---|---|---|---|---|
| SiO$_2$ | 53.5 | 53.3 | 46.6 | 46.5 | 46.0 | 45.0 | 46.4 | 46.2 |
| Al$_2$O$_3$ | 20.4 | 20.1 | 24.1 | 24.0 | 24.0 | 24.9 | 24.1 | 24.0 |
| ZnO | 10.2 | 10.3 | 10.1 | 10.0 | 10.1 | 9.9 | 10.1 | 10.1 |
| MgO | 5.9 | 5.7 | 5.8 | 5.8 | 5.8 | 5.7 | 5.8 | 5.8 |
| ZrO$_2$ | 1.7 | 3.1 | 3.5 | 3.5 | 3.5 | 3.6 | 3.5 | 3.5 |
| TiO$_2$ | 2.2 | 2.2 | 2.2 | 2.2 | 2.2 | 2.2 | 2.2 | 2.2 |
| Li$_2$O | | | | 3.4 | 6.9 | | 1.1 | 2.0 |
| Na$_2$O | 2.7 | 2.6 | 6.2 | 3.1 | 0.1 | 7.1 | 5.2 | 4.6 |
| K$_2$O | | | | | | | | |
| BaO | 1.2 | 1.2 | 1.2 | 1.2 | 1.2 | 1.2 | 1.2 | 1.2 |
| As$_2$O$_5$ | 0.1 | 0.1 | 0.1 | 0.1 | 0.1 | 0.1 | 0.1 | 0.1 |
| NO$_2$ | 0.2 | 0.2 | 0.2 | 0.2 | 0.2 | 0.2 | 0.2 | 0.2 |
| SnO$_2$ | | | | | | | | |
| B$_2$O$_3$ | | | | | | | | |
| CaO | | | | | | | | |
| Ce$_2$O | | | | | | | | |
| GeO$_2$ | | | | | | | | |
| HfO$_2$ | 1.8 | | | | | | | |
| La$_2$O$_3$ | | 1.0 | | | | | | |
| MnO | | | | | | | | |
| P$_2$O$_5$ | | | | | | | | |
| NiO | | | | | | | | |
| Co$_3$O$_4$ | | | | | | | | |
| SrO | | | | | | | | |
| Ta$_2$O$_5$ | | | | | | | | |
| ZrO$_2$ + TiO$_2$ | 3.9 | 5.3 | 5.7 | 5.6 | 5.6 | 5.8 | 5.7 | 5.7 |

| | 25 | 26 | 27 | 28 | 29 | 30 | 31 | 32 |
|---|---|---|---|---|---|---|---|---|
| Density (g/cm$^3$) | 2.94 | 2.962 | 2.91 | 2.926 | 0 | 2.921 | 2.918 | 2.918 |
| Poisson's Ratio | | | 0.259 | | | 0.259 | 0.257 | 0.261 |
| Shear Modulus (GPa) | | | 39.02 | | | 39.2 | 40.1 | 40.2 |
| Young's Modulus (GPa) | | | 98.25 | | | 98.7 | 100.7 | 101.4 |
| Liquidus - Air (24 hrs, ° C.) | | | >1490 C. | | | | | |
| Liquidus - Internal (24 hrs, ° C.) | | | >1490 C. | | | | | |
| Liquidus - Platinum (24 hrs, ° C.) | | | >1490 C. | | | | | |
| Liquidus - Primary Phase | | | can't identify | | | | | |
| Liquidus - Secondary Phase | | | can't identify | | | | | |
| Anneal Point (° C.) | | | | | | | | |
| Strain Point (° C.) | | | | | | | | |
| RI @589.3 | | | 1.5935 | | | 1.5939 | 1.5961 | 1.5959 |

| Analyzed (mol %) | 33 | 34 | 35 | 36 | 37 | 38 | 39 | 40 |
|---|---|---|---|---|---|---|---|---|
| SiO$_2$ | 46.3 | 54.0 | 53.2 | 53.8 | 53.8 | 53.4 | 53.5 | 52.4 |
| Al$_2$O$_3$ | 24.0 | 20.7 | 21.2 | 20.6 | 20.8 | 20.9 | 20.9 | 20.7 |
| ZnO | 10.1 | 10.4 | 10.3 | 10.4 | 10.4 | 10.1 | 10.1 | 10.0 |
| MgO | 5.8 | 6.0 | 5.8 | 5.9 | 5.9 | 5.7 | 5.7 | 5.7 |
| ZrO$_2$ | 3.5 | 2.6 | 4.4 | 3.2 | 3.2 | 4.7 | 4.6 | 4.3 |
| TiO$_2$ | 2.2 | 2.2 | | 1.7 | 1.4 | | | |
| Li$_2$O | 2.6 | | | | | | | |
| Na$_2$O | 3.9 | 2.6 | 3.6 | 2.9 | 3.0 | 3.6 | 3.6 | 5.3 |
| K$_2$O | | | | | | | | |
| BaO | 1.2 | 1.2 | 1.2 | 1.2 | 1.2 | 1.2 | 1.2 | 1.2 |
| As$_2$O$_5$ | 0.1 | 0.1 | 0.1 | 0.1 | 0.1 | | | 0.1 |

TABLE 4-continued

| | | | | | | | | |
|---|---|---|---|---|---|---|---|---|
| NO₂ | 0.2 | 0.2 | 0.2 | 0.2 | 0.2 | 0.2 | 0.2 | 0.2 |
| SnO₂ | | | | | | 0.1 | 0.1 | |
| B₂O₃ | | | | | | | | |
| CaO | | | | | | | | |
| Ce₂O | | | | | | | | |
| GeO₂ | | | | | | | | |
| HfO₂ | | | | | | | | |
| La₂O₃ | | | | | | | | |
| MnO | | | | | | | | |
| P₂O₅ | | | | | | | | |
| NiO | | | | | | | | |
| Co₃O₄ | | | | | | | | |
| SrO | | | | | | | | |
| Ta₂O₅ | | | | | | | | |
| ZrO₂ + TiO₂ | 5.7 | 4.8 | 4.4 | 4.8 | 4.6 | 4.7 | 4.6 | 4.3 |

| | 33 | 34 | 35 | 36 | 37 | 38 | 39 | 40 |
|---|---|---|---|---|---|---|---|---|
| Density (g/cm³) | 2.922 | 2.864 | 2.892 | 2.875 | 2.875 | 2.896 | 2.896 | 2.881 |
| Poisson's Ratio | 0.263 | 0.254 | 0.253 | 0.254 | 0.252 | 0.258 | 0.253 | 0.254 |
| Shear Modulus (GPa) | 40.7 | 39.2 | 39.2 | 39.2 | 39.2 | 39.2 | 39.3 | 38.3 |
| Young's Modulus (GPa) | 102.9 | 98.2 | 98.3 | 98.2 | 98.1 | 98.7 | 98.5 | 96.1 |
| Liquidus - Air (24 hrs, ° C.) | | | | | | | | |
| Liquidus - Internal (24 hrs, ° C.) | | | | | | | | |
| Liquidus - Platinum (24 hrs, ° C.) | | | | | | | | |
| Liquidus - Primary Phase | | | | | | | | |
| Liquidus - Secondary Phase | | | | | | | | |
| Anneal Point (° C.) | | | | | | | | |
| Strain Point (° C.) | | | | | | | | |
| RI @589.3 | 1.5959 | 1.5851 | 1.5820 | 1.5850 | 1.5836 | 1.5819 | 1.5824 | 1.5779 |

| Analyzed (mol %) | 41 | 42 | 43 | 44 | 45 | 46 | 47 | 48 |
|---|---|---|---|---|---|---|---|---|
| SiO₂ | 51.4 | 45.5 | 50.3 | 51.5 | 53.6 | 52.2 | 52.2 | 44.6 |
| Al₂O₃ | 20.3 | 24.8 | 22.5 | 21.0 | 20.1 | 20.5 | 20.6 | 25.2 |
| ZnO | 9.8 | 12.6 | 11.1 | 10.0 | 9.8 | 9.9 | 10.0 | 12.0 |
| MgO | 5.6 | 7.0 | 6.2 | 5.7 | 5.5 | 5.6 | 5.7 | 6.6 |
| ZrO₂ | 4.2 | 4.9 | 4.7 | 4.7 | 4.1 | 4.6 | 4.3 | 4.9 |
| TiO₂ | | | | | | | | |
| Li₂O | | | | | 1.0 | | 1.0 | |
| Na₂O | 7.1 | 3.6 | 3.6 | 5.4 | 4.3 | 5.6 | 4.6 | 5.2 |
| K₂O | | | | | | | | |
| BaO | 1.2 | 1.2 | 1.2 | 1.2 | 1.2 | 1.2 | 1.2 | 1.2 |
| As₂O₅ | 0.1 | 0.1 | 0.1 | 0.0 | 0.1 | 0.0 | 0.1 | 0.1 |
| NO₂ | 0.2 | 0.2 | 0.2 | 0.2 | 0.2 | 0.2 | 0.2 | 0.2 |
| SnO₂ | | | | | 0.1 | 0.1 | | |
| B₂O₃ | | | | | | | | |
| CaO | | | | | | | | |
| Ce₂O | | | | | | | | |
| GeO₂ | | | | | | | | |
| HfO₂ | | | | | | | | |
| La₂O₃ | | | | | | | | |
| MnO | | | | | | | | |
| P₂O₅ | | | | | | | | |
| NiO | | | | | | | | |
| Co₃O₄ | | | | | | | | |
| SrO | | | | | | | | |
| Ta₂O₅ | | | | | | | | |
| ZrO₂ + TiO₂ | 4.2 | 4.9 | 4.7 | 4.7 | 4.1 | 4.6 | 4.3 | 4.9 |

TABLE 4-continued

|  | 41 | 42 | 43 | 44 | 45 | 46 | 47 | 48 |
|---|---|---|---|---|---|---|---|---|
| Density (g/cm³) | 2.869 |  | 3.015 | 2.898 | 2.867 | 2.898 | 2.867 | 2.982 |
| Poisson's Ratio | 0.252 | 0.26 | 0.269 |  |  |  |  |  |
| Shear Modulus (GPa) | 37.2 | 40.2 | 41.3 |  |  |  |  |  |
| Young's Modulus (GPa) | 93.1 | 101.2 | 104.7 |  |  |  |  |  |
| Liquidus - Air (24 hrs, °C.) |  |  |  |  |  |  |  |  |
| Liquidus - Internal (24 hrs, °C.) |  |  |  |  |  |  |  |  |
| Liquidus - Platinum (24 hrs, °C.) |  |  |  |  |  |  |  |  |
| Liquidus - Primary Phase |  |  |  |  |  |  |  |  |
| Liquidus - Secondary Phase |  |  |  |  |  |  |  |  |
| Anneal Point (°C.) |  | 731.6 |  |  |  |  |  |  |
| Strain Point (°C.) |  | 689.9 |  |  |  |  |  |  |
| RI @589.3 | 1.5740 | 1.5919 | 1.60351 |  |  |  |  |  |

| Analyzed (mol %) | 49 | 50 | 51 | 52 | 53 | 54 | 55 | 56 |
|---|---|---|---|---|---|---|---|---|
| SiO₂ | 45.3 | 45.5 | 45.4 | 53.3 | 52.4 | 51.5 | 50.6 | 52.2 |
| Al₂O₃ | 24.8 | 24.6 | 24.6 | 21.0 | 20.5 | 20.5 | 19.9 | 20.6 |
| ZnO | 12.6 | 12.5 | 12.6 | 10.1 | 9.9 | 9.9 | 9.7 | 9.9 |
| MgO | 6.9 | 6.9 | 6.9 | 0.0 | 5.7 | 5.5 | 5.4 | 4.7 |
| ZrO₂ | 5.1 | 5.0 | 5.0 | 4.3 | 4.6 | 4.5 | 4.6 | 4.4 |
| TiO₂ |  |  |  |  |  |  |  |  |
| Li₂O |  |  |  |  |  |  |  |  |
| Na₂O | 3.6 | 3.6 | 3.6 | 3.8 | 3.7 | 3.7 | 3.6 | 3.7 |
| K₂O |  |  |  |  |  |  |  |  |
| BaO | 1.2 | 1.2 | 1.2 | 1.2 | 1.2 | 1.1 | 1.1 | 1.1 |
| As₂O₅ | 0.1 | 0.1 | 0.1 | 0.1 | 0.1 | 0.1 | 0.1 | 0.1 |
| NO₂ | 0.2 | 0.2 | 0.2 | 0.2 | 0.2 | 0.2 | 0.2 | 0.2 |
| SnO₂ |  |  |  |  |  |  |  |  |
| B₂O₃ |  |  |  |  |  | 2.9 | 4.7 | 1.0 |
| CaO |  |  |  | 5.7 | 0.2 |  |  | 1.1 |
| Ce₂O | 0.1 | 0.2 | 0.3 |  |  |  |  |  |
| GeO₂ |  |  |  |  |  |  |  |  |
| HfO₂ |  |  |  |  |  |  |  |  |
| La₂O₃ |  |  |  |  |  |  |  |  |
| MnO |  |  |  |  |  |  |  |  |
| P₂O₅ |  |  |  |  | 1.4 |  |  | 0.9 |
| NiO |  |  |  |  |  |  |  |  |
| Co₃O₄ |  |  |  |  |  |  |  |  |
| SrO |  |  |  |  |  |  |  |  |
| Ta₂O₅ |  |  |  |  |  |  |  |  |
| ZrO₂ + TiO₂ | 5.1 | 5.0 | 5.0 | 4.3 | 4.6 | 4.5 | 4.6 | 4.4 |

|  | 49 | 50 | 51 | 52 | 53 | 54 | 55 | 56 |
|---|---|---|---|---|---|---|---|---|
| Density (g/cm³) |  |  |  | 2.894 | 2.875 | 2.865 | 2.842 | 2.865 |
| Poisson's Ratio |  |  |  | 0.251 | 0.253 | 0.252 | 0.255 | 0.248 |
| Shear Modulus (GPa) |  |  |  | 38.3 | 38.5 | 38.3 | 37.5 | 38.2 |
| Young's Modulus (GPa) |  |  |  | 95.9 | 96.4 | 95.8 | 94.2 | 95.3 |
| Liquidus - Air (24 hrs, °C.) |  |  |  |  |  |  |  |  |
| Liquidus - Internal (24 hrs, °C.) |  |  |  | 1480 | 1475 |  | 1470 |  |

TABLE 4-continued

| | | | | | | | | |
|---|---|---|---|---|---|---|---|---|
| Liquidus - Platinum (24 hrs, ° C.) | | >1500 | >1500 | | >1500 | | | |
| Liquidus - Primary Phase | | | | | | | | |
| Liquidus - Secondary Phase | | | | | | | | |
| Anneal Point (° C.) | | | | | | | | |
| Strain Point (° C.) | | | | | | | | |
| RI @589.3 | | 1.5830 | 1.5775 | 1.5786 | 1.5766 | 1.5774 | | |

| Analyzed (mol %) | 57 | 58 | 59 | 60 | 61 | 62 | 63 | 64 |
|---|---|---|---|---|---|---|---|---|
| $SiO_2$ | 52.1 | 50.1 | 49.7 | 53.3 | 52.5 | 53.2 | 52.3 | 53.1 |
| $Al_2O_3$ | 20.3 | 19.5 | 19.6 | 21.2 | 21.0 | 21.2 | 20.9 | 21.3 |
| ZnO | 9.9 | 9.4 | 9.5 | 10.2 | 10.1 | 10.2 | 10.0 | 10.2 |
| MgO | 5.6 | 2.2 | 2.2 | 5.8 | 5.7 | 5.8 | 5.7 | 5.8 |
| $ZrO_2$ | 4.6 | 4.4 | 4.4 | 4.4 | 4.3 | 4.4 | 4.6 | 4.4 |
| $TiO_2$ | | | | | | | | |
| $Li_2O$ | | | 1.2 | | | | | |
| $Na_2O$ | 3.7 | 3.6 | 3.6 | 3.8 | 3.8 | 3.8 | 3.9 | 3.9 |
| $K_2O$ | | 1.0 | | | | | | |
| BaO | 1.2 | 1.1 | 1.1 | | | | | |
| $As_2O_5$ | 0.1 | 0.1 | 0.1 | 0.1 | 0.1 | 0.1 | 0.1 | 0.1 |
| $NO_2$ | 0.2 | 0.2 | 0.2 | | | | | |
| $SnO_2$ | | | | | | | | |
| $B_2O_3$ | | 3.8 | 4.0 | | | | | |
| CaO | | 2.2 | 2.2 | | | 1.2 | 2.4 | |
| $Ce_2O$ | | | | | | | | |
| $GeO_2$ | | | | | | | | |
| $HfO_2$ | | | | | | | | |
| $La_2O_3$ | | | | | | | | |
| MnO | | | | | | | | 1.2 |
| $P_2O_5$ | 2.2 | 2.2 | 2.2 | | | | | |
| NiO | | | | | | | | |
| $Co_3O_4$ | | | | | | | | |
| SrO | | | | 1.2 | 2.3 | | | |
| $Ta_2O_5$ | | | | | | | | |
| $ZrO_2 + TiO_2$ | 4.6 | 4.4 | 4.4 | 4.4 | 4.3 | 4.4 | 4.6 | 4.4 |

| Analyzed (mol %) | 65 | 66 | 67 | 68 | 69 | 70 | 71 | 72 |
|---|---|---|---|---|---|---|---|---|
| $SiO_2$ | 53.3 | 54.3 | 53.7 | 53.5 | 53.1 | 53.15 | 53.2 | 53.8 |
| $Al_2O_3$ | 21.1 | 20.8 | 21.0 | 21.0 | 20.8 | 20.8 | 20.8 | 21 |
| ZnO | 10.2 | 9.9 | 10.0 | 10.1 | 15.5 | 15.5 | 15.5 | 10 |
| MgO | 5.8 | 5.8 | 5.8 | 5.8 | | | | 5.7 |
| $ZrO_2$ | 4.6 | 2.5 | 4.5 | 4.5 | 5.2 | 5.2 | 5.2 | 5.3 |
| $TiO_2$ | | | | | | | | |
| $Li_2O$ | | | | | | | | |
| $Na_2O$ | 3.9 | 3.8 | 3.8 | 3.8 | 4.1 | 4.1 | 4.1 | 4.1 |
| $K_2O$ | | | | | | | | |
| BaO | | | | | 1.2 | 1.2 | 1.2 | |
| $As_2O_5$ | 0.1 | 0.1 | 0.1 | 0.1 | 0.1 | | | 0.1 |
| $NO_2$ | | | | | | | | |
| $SnO_2$ | | | | | | | 0.05 | |
| $B_2O_3$ | | | | | | | | |
| CaO | | | | | | | | |
| $Ce_2O$ | | | | | | | | |
| $GeO_2$ | 1.0 | | | | | | | |
| $HfO_2$ | | | | | | | | |
| $La_2O_3$ | | | | | | | | |
| MnO | | | | | | | | |
| $P_2O_5$ | | 2.7 | | | | | | |
| NiO | | | 1.0 | | | | | |
| $Co_3O_4$ | | | | 1.1 | | | | |
| SrO | | | | | | | | |
| $Ta_2O_5$ | | | | | | | | |
| $ZrO_2 + TiO_2$ | 4.6 | 2.5 | 4.5 | 4.5 | 5.2 | 5.2 | 5.2 | 5.3 |

| Analyzed (mol %) | 73 | 74 | 75 | 76 | 77 |
|---|---|---|---|---|---|
| $SiO_2$ | 53.85 | 53.8 | 52 | 52.05 | 52.1 |
| $Al_2O_3$ | 21 | 21 | 21.4 | 21.4 | 21.4 |

TABLE 4-continued

| | | | | | |
|---|---|---|---|---|---|
| ZnO | 10 | 10 | 9.7 | 9.7 | 9.7 |
| MgO | 5.7 | 5.7 | 5.5 | 5.5 | 5.5 |
| $ZrO_2$ | 5.3 | 5.3 | 5.1 | 5.1 | 5.1 |
| $TiO_2$ | | | | | |
| $Li_2O$ | | | 1 | 1 | 1 |
| $Na_2O$ | 4.1 | 4.1 | 4 | 4 | 4 |
| $K_2O$ | | | | | |
| BaO | | | 1.2 | 1.2 | 1.2 |
| $As_2O_5$ | | | 0.1 | 0.05 | |
| $NO_2$ | | | | | |
| $SnO_2$ | 0.05 | | | | |
| $B_2O_3$ | | | | | |
| CaO | | | | | |
| $Ce_2O$ | | | | | |
| $GeO_2$ | | | | | |
| $HfO_2$ | | | | | |
| $La_2O_3$ | | | | | |
| MnO | | | | | |
| $P_2O_5$ | | | | | |
| NiO | | | | | |
| $Co_3O_4$ | | | | | |
| SrO | | | | | |
| $Ta_2O_5$ | | | | | |
| $ZrO_2 + TiO_2$ | 5.3 | 5.3 | 5.1 | 5.1 | 5.1 |

The Poisson's ratio was measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts." The shear modulus was measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts." The liquidus temperature was measured in accordance with ASTM C829-81 (2015), titled "Standard Practice for Measurement of Liquidus Temperature of Glass by the Gradient Furnace Method" or the gradient boat method. The air, internal, and platinum liquidus temperatures refer to the location of the measurement in the sample, with internal being the interior of the sample, air being the air-sample interface, and platinum being the platinum crucible-sample interface. In some isolated cases, the liquidus temperature was determined by crystallizing a sample from the melt, and observing the temperature at which crystallization started. The refractive index (RI) of the precursor glass was measured at a wavelength of 589.3 nm.

Additional glass ceramics were produced by altering the ceram schedules for the compositions previously reported. The properties of the resulting glass ceramics and the ceram schedules that produced the glass ceramics are reported in Table 5 below. Additionally, some of the glass ceramics were ion exchanged, as reported in Table 5. The density difference reported in Table 5 refers to the change in the density of the precursor glass when forming the glass ceramic.

TABLE 5

| Composition | 1 | 2 | 3 | 4 | 5 | 6 | 7 | 8 |
|---|---|---|---|---|---|---|---|---|
| Ceram Schedule | L | L | L | L | L | L | L | L |
| Density (g/cm³) | 2.792 | 2.828 | 2.872 | 2.955 | 3.014 | 3.054 | 2.93 | 2.984 |
| Density Difference (%) | 3.08 | 2.93 | 2.72 | 2.84 | 3.02 | 3.80 | 2.25 | 3.25 |
| Phase 1 | G | G | G | G | G | G | G | G |
| Crystallite Size Phase 1 (Å) | 66 | 65 | 61 | 61 | 61 | 62 | 58 | 79 |
| Phase 2 | T | | | | | | | T |
| Crystallite Size Phase 2 (Å) | | | | | | | | |
| Glass (wt %) | 74 | 73 | 70 | 66 | 64 | 60 | 68 | 65 |
| Gahnite (wt %) | 25.2 | 25.5 | 28.9 | 32 | 34 | 39 | 30 | 28 |
| Tet $ZrO_2$ (wt %) | 0.9 | 1.5 | 0.8 | 2.4 | 2.5 | 1.6 | 1.9 | 6.7 |
| Other phases (wt %) | | | | | | | | |
| Hardness (GPa) | 10.32 | | 10.70 | | | 11.11 | | |
| Poisson's Ratio | 0.189 | 0.197 | 0.2 | 0.199 | 0.209 | 0.203 | 0.188 | 0.199 |
| Shear Modulus (GPa) | 41.4 | 42.1 | 43.1 | 45.0 | 46.1 | 47.0 | 46.0 | 44.3 |
| Young's Modulus (GPa) | 98.3 | 100.7 | 103.4 | 107.8 | 111.4 | 113.1 | 109.4 | 106.1 |
| Hardness VHN/200 gram load | 776 | 814 | 811 | 821 | 843 | 867 | 832 | 833 |
| stdev | 19.5 | 22.7 | 19.6 | 20.6 | 21.8 | 17.0 | 15.3 | 8.7 |
| Scratch Threshold (N) | 2.85 | | 3.5 | | | 4 | | |

TABLE 5-continued

|  |  |  |  |
|---|---|---|---|
| RI @ 589.3 nm | 3 | 3.75 | 4.2 |
| Anneal Point (° C.) |  |  |  |
| Strain Point (° C.) |  |  |  |

| Composition | 9 | 10 | 13 | 14 | 15 | 16 | 17 | 18 |
|---|---|---|---|---|---|---|---|---|
| Ceram Schedule | L | B | B | B | C | B | B | E |
| Density (g/cm³) | 2.926 | 2.759 |  | 3.017 |  |  | 3.026 | 3.039 |
| Density Difference (%) | 3.35 | 2.54 |  | 3.41 |  |  | 3.47 | 4.05 |
| Phase 1 | G | G | G | G | G | G | G | G |
| Crystallite Size Phase 1 (Å) | 61 | 78 | 71 | 67 | 63 | 75 | 84 | 68 |
| Phase 2 |  | T | T | T | T | T | T | T |
| Crystallite Size Phase 2 (Å) |  |  |  | 88 |  |  |  |  |
| Glass (wt %) | 69 | 75 | 63 | 62 | 66 | 61 | 60 | 61 |
| Gahnite (wt %) | 29 | 24 | 32.6 | 35 | 30 | 33.4 | 34.9 | 35.6 |
| Tet ZrO₂ (wt %) | 2.2 | 1.2 | 4.8 | 4.0 | 4.5 | 5.2 | 4.7 | 3.2 |
| Other phases (wt %) |  |  |  |  |  |  |  |  |
| Hardness (GPa) |  | 10.08 | 9.96 | 10.28 | 10.28 | 9.83 |  |  |
| Poisson's Ratio | 0.212 | 0.189 | 0.206 | 0.212 | 0.213 | 0.203 | 0.201 |  |
| Shear Modulus (GPa) | 44.2 | 40.27 | 44.82 | 45.78 | 45.85 | 44.20 | 43.78 |  |
| Young's Modulus (GPa) | 107.1 | 95.70 | 108.11 | 111.01 | 111.14 | 106.25 | 105.97 |  |
| Hardness - VHN/200 gram load | 830 | 714 | 726 | 750 | 749 | 719 |  |  |
| stdev | 17.0 | 5.21 | 28.02 | 20.53 | 6.24 | 31.84 |  |  |
| Scratch Threshold (N) |  |  |  |  |  |  |  |  |
| RI @589.3 |  |  |  |  |  |  | 1.6074 |  |
| Anneal Point (° C.) |  | 978.6 | 906.4 | 877.5 | 855.8 | 890.8 | 880.2 |  |
| Strain Point (° C.) |  | 910.7 | 841.6 | 812.6 | 792.1 | 824.9 | 814.2 |  |

| Composition | 19 | 20 | 21 | 22 | 23 | 24 | 25 | 26 |
|---|---|---|---|---|---|---|---|---|
| Ceram Schedule | E | B | E | E | B | B | B | B |
| Density (g/cm³) | 3.04 | 3.04 | 3.053 | 3.061 |  | 3.076 | 3.055 | 3.078 |
| Density Difference (%) | 3.85 | 3.22 | 3.96 | 4.15 |  | 4.00 | 3.76 | 3.77 |
| Phase 1 | G | G | G | G | G | G | G | G |
| Crystallite Size Phase 1 (Å) | 68 | 86 | 75 | 68 | 90 | 99 | 135 | 150 |
| Phase 2 | T | T | T | T, V | T | T | T | T |
| Crystallite Size Phase 2 (Å) |  |  |  |  |  | 80 | 118 | 110 |
| Glass (wt %) | 63 | 59 | 59 |  | 61 | 54 | 57 | 57 |
| Gahnite (wt %) | 34.3 | 36.3 | 36.8 |  | 35.2 | 41 | 36 | 38 |
| Tet ZrO₂ (wt %) | 2.9 | 5 | 3.8 |  | 4.3 | 5.1 | 7.2 | 5.2 |
| Other phases (wt %) |  |  |  |  |  |  |  |  |
| Hardness (GPa) |  |  |  |  |  | 9.61 | 9.68 |  |

TABLE 5-continued

| | | | | |
|---|---|---|---|---|
| Poisson's Ratio | 0.212 | | 0.202 | 0.204 |
| Shear Modulus (GPa) | 43.92 | | 44.33 | 43.4 |
| Young's Modulus (GPa) | 106.46 | | 106.593 | 104.4 |
| Hardness - VHN/200 gram load stdev | | | | |
| Scratch Threshold (N) | | | | |
| RI @589.3 | 1.6104 | | 1.5916 | 1.59645 |
| Anneal Point (° C.) | | | | 881.6 |
| Strain Point (° C.) | | | | 809.6 |

| Composition | 27 | 28 | 29 | 30 | 31 | 32 | 33 | 34 |
|---|---|---|---|---|---|---|---|---|
| Ceram Schedule | B | B | B | B | B | B | B | D |
| Density (g/cm³) | 3.049 | | | 3.056 | 3.051 | 3.054 | 3.054 | 2.987 |
| Density Difference (%) | 4.56 | | | 4.42 | 4.36 | 4.45 | 4.32 | 4.12 |
| Phase 1 | G | G | | G | G | G | G | G |
| Crystallite Size Phase 1 (Å) | 80 | 83 | | 73 | 68 | 72 | 94 | 98 |
| Phase 2 | T | B, T | | T | T | T | T | T |
| Crystallite Size Phase 2 (Å) | 75 | 440, 123 | | 69 | 38 | | 81 | |
| Glass (wt %) | 51 | 47 | | 51 | 54 | 55 | 55 | 60 |
| Gahnite (wt %) | 42 | 41 | | 43 | 40 | 39 | 39 | 37 |
| Tet ZrO₂ (wt %) | 6.3 | 6 | | 6.7 | 5.9 | 5.8 | 5.8 | 3.4 |
| Other phases (wt %) | | 5.5 | | | | | | |
| Hardness (GPa) | 9.32 | | | | | | | |
| Poisson's Ratio | 0.22 | | | | | | | |
| Shear Modulus (GPa) | 43.4 | | | | | | | |
| Young's Modulus (GPa) | 105.8 | | | | | | | |
| Hardness - VHN/200 gram load stdev | | | | | | | | |
| Scratch Threshold (N) | | | | | | | | |
| RI @589.3 | 1.6015 | | | | | | | |
| Anneal Point (° C.) | 847.9 | | | | | | | |
| Strain Point (° C.) | 786.2 | | | | | | | |

| Composition | 35 | 36 | 37 | 38 | 39 | 40 | 41 | 42 |
|---|---|---|---|---|---|---|---|---|
| Ceram Schedule | D | D | D | D | D | D | D | D |
| Density (g/cm³) | 3.019 | 2.996 | 2.993 | 3.014 | 3.014 | 2.996 | 2.988 | |
| Density Difference (%) | 4.21 | 4.04 | 3.94 | 3.92 | 3.92 | 3.84 | 3.98 | |

TABLE 5-continued

| | | | | | | | |
|---|---|---|---|---|---|---|---|
| Phase 1 | G | G | G | G | G | G | G |
| Crystallite Size Phase 1 (Å) | 85 | 83 | 93 | 91 | 98 | 107 | 149 |
| Phase 2 | T | T | T | T | T | T | T |
| Crystallite Size Phase 2 (Å) | | | | 55 | 90 | 80 | 191 |
| Glass (wt %) | 60 | 60 | 60 | 59 | 58 | 57 | 56 |
| Gahnite (wt %) | 33 | 35 | 35 | 33 | 34 | 35 | 35 |
| Tet ZrO$_2$ (wt %) | 6.9 | 4.6 | 4.6 | 7.5 | 7.7 | 7.9 | 8.8 |
| Other phases (wt %) | | | | | | | |
| Hardness (GPa) | | | | | | | |
| Poisson's Ratio | | | | | | | |
| Shear Modulus (GPa) | | | | | | | |
| Young's Modulus (GPa) | | | | | | | |
| Hardness - VHN/200 gram load stdev | | | | | | | |
| Scratch Threshold (N) | | | | | | | |
| RI @589.3 | | | | | | | |
| Anneal Point (° C.) | | | | | | | |
| Strain Point (° C.) | | | | | | | |

| Composition | 43 | 44 | 45 | 46 | 47 | 48 | 49 | 50 |
|---|---|---|---|---|---|---|---|---|
| Ceram Schedule | D | N | N | N | N | N | N | N |
| Density (g/cm$^3$) | 3.191 | 3.026 | 2.981 | 3.026 | 2.981 | 3.162 | 3.203 | |
| Density Difference (%) | 5.52 | 4.23 | 3.82 | 4.23 | 3.82 | 5.69 | | |
| Phase 1 | G | G | G | | | G | G | |
| Crystallite Size Phase 1 (Å) | 93 | 83 | 105 | | | 49 | 70 | |
| Phase 2 | T | T | T | | | T | T | |
| Crystallite Size Phase 2 (Å) | 86 | 136 | 85 | | | 90 | 50 | |
| Glass (wt %) | 49 | 54 | 60 | | | 47 | 49 | |
| Gahnite (wt %) | 43 | 37 | 33 | | | 44 | 43 | |
| Tet ZrO$_2$ (wt %) | 8.3 | 8.8 | 7.2 | | | 8.3 | 8 | |
| Other phases (wt %) | | | | | | | | |
| Hardness (GPa) | | | | | | | | |
| Poisson's Ratio | | | | | | | | |
| Shear Modulus (GPa) | | | | | | | | |
| Young's Modulus (GPa) | | | | | | | | |
| Hardness - VHN/200 gram load stdev | | | | | | | | |
| Scratch Threshold (N) | | | | | | | | |

TABLE 5-continued

| | | | | | | | |
|---|---|---|---|---|---|---|---|
| RI @589.3 | | 1.5840 | 1.5858 | | | | |
| Anneal Point (° C.) | | | | | | | |
| Strain Point (° C.) | | | | | | | |

| Composition | 51 | 52 | 53 | 54 | 55 | 56 | 57 | 58 |
|---|---|---|---|---|---|---|---|---|
| Ceram Schedule | N | N | N | N | N | N | O | O |
| Density (g/cm³) | | 2.988 | 2.984 | 2.97 | 2.946 | 2.972 | 2.93 | 2.79 |
| Density Difference (%) | | 3.15 | 3.65 | 3.54 | 3.53 | 3.60 | | |
| Phase 1 | | G | G | G | G | G | | |
| Crystallite Size Phase 1 (Å) | | 97 | 104 | 102 | 115 | 102 | | |
| Phase 2 | | T | T | T | T | T | | |
| Crystallite Size Phase 2 (Å) | | 91 | 68 | 93 | 95 | 69 | | |
| Glass (wt %) | | 61 | 60 | 58 | 58 | 60 | 67 | 87 |
| Gahnite (wt %) | | 31 | 32 | 34 | 34 | 33 | 26 | 4.0 |
| Tet ZrO₂ (wt %) | | 7.9 | 7.5 | 7.7 | 8.1 | 7.5 | 7.9 | 9.2 |
| Other phases (wt %) | | | | | | | | |
| Hardness (GPa) | | 9.30 | 9.43 | 9.53 | 9.08 | 9.51 | | |
| Poisson's Ratio | | 0.222 | 0.206 | 0.213 | 0.218 | 0.212 | | |
| Shear Modulus (GPa) | | 41.2 | 41.6 | 40.4 | 38.5 | 41.2 | | |
| Young's Modulus (GPa) | | 100.5 | 100.5 | 98.0 | 93.9 | 99.7 | | |
| Hardness - VHN/200 gram load stdev | | | | | | | | |
| Scratch Threshold (N) | | | | | | | | |
| RI @589.3 | | 1.5860 | 1.5793 | 1.5811 | 1.5791 | 1.5796 | | |
| Anneal Point (° C.) | | | | | | | | |
| Strain Point (° C.) | | | | | | | | |

| Composition | 59 | 60 | 61 | 62 | 63 | 64 | 65 |
|---|---|---|---|---|---|---|---|
| Ceram Schedule | O | N | N | N | N | N | N |
| Density (g/cm³) | 2.805 | 2.995 | 3.021 | 2.981 | 2.996 | 2.998 | 2.986 |
| Density Difference (%) | | | | | | | |
| Phase 1 | | | | | | | |
| Crystallite Size Phase 1 (Å) | | | | | | | |
| Phase 2 | | | | | | | |
| Crystallite Size Phase 2 (Å) | | | | | | | |
| Glass (wt %) | 92 | 62 | 59 | 60 | 59 | 59 | 61 |
| Gahnite (wt %) | | 34 | 34 | 33 | 34 | 34 | 32 |
| Tet ZrO₂ (wt %) | 8.3 | 3.9 | 7.4 | 6.6 | 7.7 | 6.6 | 6.3 |
| Other phases (wt %) | | | | | | | |
| Hardness (GPa) | | | | | | | |

TABLE 5-continued

Poisson's Ratio
Shear Modulus (GPa)
Young's Modulus (GPa)
Hardness - VHN/200 gram load
stdev
Scratch Threshold (N)
RI @589.3
Anneal Point (° C.)
Strain Point (° C.)

| Composition | 10 | 13 | 14 | 15 | 16 |
|---|---|---|---|---|---|
| Ceram Schedule | B | B | B | C | B |
| Bath Composition | 50% KNO₃, 50% NaNO₃ | 100% KNO₃ | 100% NaNO₃ | 100% NaNO₃ | 100% KNO₃ |
| Bath Temperature (° C.) | 430 | 430 | 430 | 430 | 430 |
| IOX Time (hrs) | 19.5 | 19.5 | 19.5 | 19.5 | 19.5 |

| Composition | 1 | 2 | 3 | 4 | 5 | 6 | 7 | 8 |
|---|---|---|---|---|---|---|---|---|
| Ceram Schedule | F | F | F | F | F | F | F | F |
| Density (g/cm³) | | | | | | | | |
| Density Difference (%) | | | | | | | | |
| Phase 1 | G | G | G | G | G | G | G | G |
| Crystallite Size Phase 1 (Å) | 60 | 55 | 54 | 55 | 52 | 56 | 51 | 60 |
| Phase 2 | | | | | | | | T |
| Crystallite Size Phase 2 (Å) | | | | | | | | 40 |
| Glass (wt %) | | | | | | | | |
| Gahnite (wt %) | | | | | | | | |
| Tet ZrO₂ (wt %) | | | | | | | | |
| Baddeleyite (wt %) | | | | | | | | |
| MgTa₂O₆ (wt %) | | | | | | | | |
| Hardness (GPa) | | | | | | | | |
| Poisson's Ratio | | | | | | | | |
| Shear Modulus (GPa) | | | | | | | | |
| Young's Modulus (GPa) | | | | | | | | |
| RI @589.3 | | | | | | | | |
| Anneal Point (° C.) | | | | | | | | |
| Strain Point (° C.) | | | | | | | | |

TABLE 5-continued

| Composition | 9 | 10 | 11 | 12 | 13 | 14 | 15 | 16 |
|---|---|---|---|---|---|---|---|---|
| Ceram Schedule | F | L | G | G | G | G | G | G |
| Density (g/cm³) | | | | | | | | |
| Density Difference (%) | | | | | | | | |
| Phase 1 | G | G | G | G | G | G | G | G |
| Crystallite Size Phase 1 (Å) | 52 | 70 | 66 | 63 | 63 | 68 | 74 | 67 |
| Phase 2 | | | T | T | T | T | T, V, B2, S | T |
| Crystallite Size Phase 2 (Å) | | | | | 57 | 41 | *, *, 581, * | |
| Glass (wt %) | | 76 | | | | | | |
| Gahnite (wt %) | | 22.8 | | | | | | |
| Tet $ZrO_2$ (wt %) | | 1.2 | | | | | | |
| Baddeleyite (wt %) | | | | | | | | |
| $MgTa_2O_6$ (wt %) | | | | | | | | |
| Hardness (GPa) | | | | | | | | |
| Poisson's Ratio | | | | | | | | |
| Shear Modulus (GPa) | | | | | | | | |
| Young's Modulus (GPa) | | | | | | | | |
| RI @589.3 | | | | | | | | |
| Anneal Point (° C.) | | | | | | | | |
| Strain Point (° C.) | | | | | | | | |

| Composition | 22 | 23 | 30 | 31 | 32 | 33 | 34 | 35 |
|---|---|---|---|---|---|---|---|---|
| Ceram Schedule | H | I | P | P | P | P | P | P |
| Density (g/cm³) | 3.056 | | 3.066 | 3.064 | 3.066 | 3.067 | 2.988 | 3.016 |
| Density Difference (%) | 3.99 | | | | | | 4.15 | 4.11 |
| Phase 1 | G | G | | | | | G | G |
| Crystallite Size Phase 1 (Å) | 55 | 77 | | | | | 79 | 79 |
| Phase 2 | V | T | | | | | T | T |
| Crystallite Size Phase 2 (Å) | | | | | | | 62 | |
| Glass (wt %) | | 62 | | | | | 59 | 59 |
| Gahnite (wt %) | | 34.6 | | | | | 37 | 34 |
| Tet $ZrO_2$ (wt %) | | 3.8 | | | | | 3.3 | 6.8 |
| Baddeleyite (wt %) | | | | | | | | |
| $MgTa_2O_6$ (wt %) | | | | | | | | |
| Hardness (GPa) | | | | | | | | |
| Poisson's Ratio | | | | | | | | |
| Shear Modulus (GPa) | | | | | | | | |

TABLE 5-continued

| | | | | | | | | |
|---|---|---|---|---|---|---|---|---|
| Young's Modulus (GPa) | | | | | | | | |
| RI @589.3 | | | | | | | | |
| Anneal Point (° C.) | | | | | | | | |
| Strain Point (° C.) | | | | | | | | |

| Composition | 36 | 37 | 38 | 39 | 40 | 41 | 42 | 43 |
|---|---|---|---|---|---|---|---|---|
| Ceram Schedule | P | P | N | N | N | N | N | N |
| Density (g/cm³) | 2.999 | 2.997 | | | | | | |
| Density Difference (%) | 4.13 | 4.07 | | | | | | |
| Phase 1 | G | G | | | | | | |
| Crystallite Size Phase 1 (Å) | 75 | 93 | | | | | | |
| Phase 2 | T | T | | | | | | |
| Crystallite Size Phase 2 (Å) | 55 | 55 | | | | | | |
| Glass (wt %) | 60 | 60 | | | | | | |
| Gahnite (wt %) | 35 | 35 | | | | | | |
| Tet ZrO₂ (wt %) | 4.6 | 4.5 | | | | | | |
| Baddeleyite (wt %) | | | | | | | | |
| MgTa₂O₆ (wt %) | | | | | | | | |
| Hardness (GPa) | | | 10.21 | 10.18 | 9.70 | 9.14 | 10.61 | 11.06 |
| Poisson's Ratio | | | 0.206 | 0.211 | | 0.257 | 0.227 | 0.219 |
| Shear Modulus (GPa) | | | 43.8 | 43.6 | | 40.1 | 45.6 | 48.7 |
| Young's Modulus (GPa) | | | 105.6 | 105.7 | | 100.8 | 112.0 | 118.6 |
| RI @589.3 | | | 1.586037 | 1.586772 | 1.584756 | 1.583014 | 1.598411 | 1.614588 |
| Anneal Point (° C.) | | | 873.5 | 872.9 | 816.5 | 759.7 | 897 | 939.3 |
| Strain Point (° C.) | | | 810.2 | 806.9 | 754.1 | 703.3 | 833 | 880.9 |

| Composition | 44 | 45 | 46 | 47 | 52 | 53 | 54 | 55 |
|---|---|---|---|---|---|---|---|---|
| Ceram Schedule | N | N | N | N | Q | Q | Q | Q |
| Density (g/cm³) | | | | | 2.985 | 2.984 | 2.97 | 2.942 |
| Density Difference (%) | | | | | 3.05 | 3.65 | 3.54 | 3.40 |
| Phase 1 | G | G | G | G | G | G | G | G |
| Crystallite Size Phase 1 (Å) | 80 | 95 | 91 | 99 | 85 | 102 | 79 | 121 |
| Phase 2 | T | T | T | T | T | T | T | T |
| Crystallite Size Phase 2 (Å) | 120 | 100 | 98 | 101 | 58 | 55 | 76 | 56 |
| Glass (wt %) | 54 | 60 | 56 | 58 | 62 | 60 | 59 | 59 |
| Gahnite (wt %) | 37 | 33 | 36 | 34 | 30 | 32 | 33 | 33 |
| Tet ZrO₂ (wt %) | 8.5 | 7.5 | 8.3 | 7.7 | 8.3 | 7.7 | 7.6 | 8.1 |
| Baddeleyite (wt %) | | | | | | | | |
| MgTa₂O₆ (wt %) | | | | | | | | |

TABLE 5-continued

| | | | | | | | | |
|---|---|---|---|---|---|---|---|---|
| Hardness (GPa) | | | 9.58 | 8.71 | | | | |
| Poisson's Ratio | 0.209 | 0.217 | | | | | | |
| Shear Modulus (GPa) | 41.9 | 43.0 | | | | | | |
| Young's Modulus (GPa) | 101.2 | 104.6 | | | | | | |
| RI @589.3 | | | | | | | | |
| Anneal Point (° C.) | 797.2 | 766 | | | | | | |
| Strain Point (° C.) | 737.7 | 705.8 | | | | | | |

| Composition | 56 | 57 | 58 | 59 | 60 | 61 | 62 | 63 |
|---|---|---|---|---|---|---|---|---|
| Ceram Schedule | Q | N | N | N | N | N | N | N |
| Density (g/cm³) | 2.972 | | | | | | | |
| Density Difference (%) | 3.60 | | | | | | | |
| Phase 1 | G | | | | | | | |
| Crystallite Size Phase 1 (Å) | 95 | | | | | | | |
| Phase 2 | T | | | | | | | |
| Crystallite Size Phase 2 (Å) | 109 | | | | | | | |
| Glass (wt %) | 61 | 63 | 65 | 66 | | | | |
| Gahnite (wt %) | 32 | 29 | 26 | 26 | | | | |
| Tet ZrO₂ (wt %) | 7.4 | 7.9 | 7.5 | 7.1 | | | | |
| Baddeleyite (wt %) | | | 1.0 | 1.1 | | | | |
| MgTa₂O₆ (wt %) | | | | | | | | |
| Hardness (GPa) | | | | | | | | |
| Poisson's Ratio | | | | | | | | |
| Shear Modulus (GPa) | | | | | | | | |
| Young's Modulus (GPa) | | | | | | | | |
| RI @589.3 | | | | | | | | |
| Anneal Point (° C.) | | | | | | | | |
| Strain Point (° C.) | | | | | | | | |

| Composition | 64 | 65 | 66 | 67 | 68 | 69 |
|---|---|---|---|---|---|---|
| Ceram Schedule | N | N | N | N | N | N |
| Density (g/cm³) | | | 2.75 | 3.012 | 3.05 | 3.453 |
| Density Difference (%) | | | | | | |
| Phase 1 | | | | | | |
| Crystallite Size Phase 1 (Å) | | | | | | |
| Phase 2 | | | | | | |
| Crystallite Size Phase 2 (Å) | | | | | | |
| Glass (wt %) | | | 98 | 59 | 56 | 69 |
| Gahnite (wt %) | | | 1.9 | 35 | 38 | 17 |

TABLE 5-continued

| | | | | | | | | |
|---|---|---|---|---|---|---|---|---|
| Tet ZrO$_2$ (wt %) | | | | | 6.5 | 6.5 | | |
| Baddeleyite (wt %) | | | | | | | | |
| MgTa$_2$O$_6$ (wt %) | | | | | | | | 13.42 |
| Hardness (GPa) | | | | | | | | |
| Poisson's Ratio | | | | | | | | |
| Shear Modulus (GPa) | | | | | | | | |
| Young's Modulus (GPa) | | | | | | | | |
| RI @589.3 | | | | | | | | |
| Anneal Point (° C.) | | | | | | | | |
| Strain Point (° C.) | | | | | | | | |

| Composition | 1 | 2 | 3 | 4 | 5 | 6 | 7 | 8 |
|---|---|---|---|---|---|---|---|---|
| Ceram Schedule | J | J | J | J | J | J | J | J |
| Density (g/cm$^3$) | | | | | | | | |
| Density Difference (%) | | | | | | | | |
| Phase 1 | G | G | G | G | G | G | G | G |
| Crystallite Size Phase 1 (Å) | 394 | 390 | 390 | 410 | 575 | 645 | 396 | 370 |
| Phase 2 | Q, S, C, R | Q, S, C, R | Q, S, R, M | Q, S, R, M | S, R, M | Q, S, C, R, M | S, C, R, M | T, Q, M2, C |
| Crystallite Size Phase 2 (Å) | >1000, 273, 480, trace | >1000, 213, 289, 415 | 675, 250, 390, 225 | trace, 215, 370, 190 | 230, 450, trace | >1000, 420, 590, 670, trace | 22, trace, 370, trace | 220, >1000, 233, trace |
| Glass (wt %) | | | | | | | | |
| Gahnite (wt %) | | | | | | | | |
| Tet ZrO$_2$ (wt %) | | | | | | | | |

| Composition | 9 | 11 | 12 | 13 | 14 | 15 | 16 | 23 |
|---|---|---|---|---|---|---|---|---|
| Ceram Schedule | J | R | R | R | R | R | R | H |
| Density (g/cm$^3$) | | 3.027 | 3.038 | 3.032 | 3.027 | 3.030 | 3.012 | 2.948 |
| Density Difference (%) | | 3.73 | 3.82 | 3.92 | 3.73 | 3.73 | 3.92 | 2.31 |
| Phase 1 | G | G | G | G | G | G | G | G |
| Crystallite Size Phase 1 (Å) | 445 | 66 | 63 | 61 | 66 | 70 | 67 | 55 |
| Phase 2 | Q, S, C, R | T | T | T | T | T, P | T | |
| Crystallite Size Phase 2 (Å) | >1000, 325, trace, 400 | | | | | *, 700 | | |
| Glass (wt %) | | | | | | | | 78 |
| Gahnite (wt %) | | | | | | | | 17.7 |
| Tet ZrO$_2$ (wt %) | | | | | | | | 4.8 |

| | Composition | 35 |
|---|---|---|
| | Ceram Schedule | S |
| | Density (g/cm$^3$) | 3.021 |

TABLE 5-continued

|  | |
|---|---|
| Density Difference (%) | 4.27 |
| Phase 1 | G |
| Crystallite Size Phase 1 (Å) | 85 |
| Phase 2 | T |
| Crystallite Size Phase 2 (Å) | 55 |
| Glass (wt %) | 60 |
| Gahnite (wt %) | 33 |
| Tet $ZrO_2$ (wt %) | 7.3 |

| Composition | 11 | 12 | 13 | 14 | 15 | 16 | 23 | 34 |
|---|---|---|---|---|---|---|---|---|
| Ceram Schedule | K | K | K | K | K | K | I | I |
| Density (g/cm³) | 3.026 | 3.033 | 3.03 | 3.025 | 3.026 | 3.012 | | 2.985 |
| Density Difference (%) | 3.70 | 3.66 | 3.86 | 3.67 | 3.60 | 3.92 | | 4.05 |
| Phase 1 | G | G | G | G | G | G | G | G |
| Crystallite Size Phase 1 (Å) | 65 | 63 | 64 | 67 | 68 | 67 | 76 | 125 |
| Phase 2 | T | T | T | T | T, P | T | T | T |
| Crystallite Size Phase 2 (Å) | | | | | *, 900 | | 54 | 107 |
| Glass (wt %) | | | | | | | 60 | 60 |
| Gahnite (wt %) | | | | | | | 36 | 37 |
| Tet $ZrO_2$ (wt %) | | | | | | | 4.25 | 3.26 |

| Composition | 35 | 36 | 37 |
|---|---|---|---|
| Ceram Schedule | I | I | I |
| Density (g/cm³) | 3.011 | 2.992 | 2.99 |
| Density Difference (%) | 3.95 | 3.91 | 3.85 |
| Phase 1 | G | G | G |
| Crystallite Size Phase 1 (Å) | 84 | 85 | 103 |
| Phase 2 | T | T | T |
| Crystallite Size Phase 2 (Å) | 48 | 57 | 75 |
| Glass (wt %) | 59 | 60 | 60 |
| Gahnite (wt %) | 34 | 35 | 35 |
| Tet $ZrO_2$ (wt %) | 7.08 | 4.72 | 5.04 |

| Composition | 11 | 12 | 13 | 14 | 15 | 16 | 23 | 34 |
|---|---|---|---|---|---|---|---|---|
| Ceram Schedule | I | I | I | I | I | I | D | D |
| Density (g/cm³) | 3.028 | 3.035 | 3.029 | 3.026 | 3.023 | 3.012 | 2.988 | 2.979 |
| Density Difference (%) | 3.76 | 3.72 | 3.83 | 3.70 | 3.51 | 3.92 | 3.61 | 3.86 |
| Phase 1 | G | G | G | G | G | G | G | G |
| Crystallite Size Phase 1 (Å) | 68 | 68 | 65 | 68 | 71 | 71 | 87 | 138 |

TABLE 5-continued

| | | | | | | | | |
|---|---|---|---|---|---|---|---|---|
| Phase 2 Crystallite Size Phase 2 (Å) | T | T | T | T | T, V, P*, 330, 805 | T | 48 | 127 |
| Glass (wt %) | | | | | | | 60 | 60 |
| Gahnite (wt %) | | | | | | | 36 | 37 |
| Tet ZrO$_2$ (wt %) | | | | | | | 4.5 | 3.9 |
| Hardness (GPa) | | | | | | | | |
| Poisson's Ratio | | | | | | | | |
| Shear Modulus (GPa) | | | | | | | | |
| Young's Modulus (GPa) | | | | | | | | |
| RI @589.3 | | | | | | | | |
| Anneal Point (° C.) | | | | | | | | |
| Strain Point (° C.) | | | | | | | | |
| SOC (nm/mm/Mpa) | | | | | | | | |

| Composition | 35 | 36 | 37 |
|---|---|---|---|
| Ceram Schedule | D | D | D |
| Density (g/cm$^3$) | 3.012 | 2.995 | 2.988 |
| Density Difference (%) | 3.98 | 4.01 | 3.78 |
| Phase 1 | G | G | G |
| Crystallite Size Phase 1 (Å) | 96 | 98 | 108 |
| Phase 2 | T | T | T |
| Crystallite Size Phase 2 (Å) | 94 | 52 | 78 |
| Glass (wt %) | 59 | 60 | 59 |
| Gahnite (wt %) | 34 | 35 | 36 |
| Tet ZrO$_2$ (wt %) | 7.1 | 4.8 | 5.1 |
| Hardness (GPa) | 9.57 | | |
| Poisson's Ratio | 0.211 | | |
| Shear Modulus (GPa) | 43.6 | | |
| Young's Modulus (GPa) | 105.6 | | |
| RI @589.3 | 1.5859 | | |
| Anneal Point (° C.) | 862.3 | | |
| Strain Point (° C.) | 793.4 | | |
| SOC (nm/mm/Mpa) | 2.719 | | |

| Composition | 10 | 11 | 12 | 13 | 14 | 15 | 16 | 23 |
|---|---|---|---|---|---|---|---|---|
| Ceram Schedule | B | L | L | L | L | L | L | N |
| Density (g/cm$^3$) | | 3.017 | 3.027 | 3.023 | 3.023 | 3.045 | 3.007 | 2.988 |
| Density Difference (%) | | 3.41 | 3.47 | 3.64 | 3.61 | 4.20 | 3.76 | 3.61 |

TABLE 5-continued

| | | | | | | | |
|---|---|---|---|---|---|---|---|
| Phase 1 | G | G | G | G | G | G | G |
| Crystallite Size Phase 1 (Å) | 72 | 71 | 70 | 82 | 90 | 61 | 77 |
| Phase 2 | T | T | T | T | T, V, B2, S | T | T |
| Crystallite Size Phase 2 (Å) | 40 | 40 | 73 | 60 | *, 420, 808, * | 88 | 50 |
| Glass (wt %) | | | | | | | 61 |
| Gahnite (wt %) | | | | | | | 35 |
| Tet $ZrO_2$ (wt %) | | | | | | | 4.5 |

| | Composition | 35 |
|---|---|---|
| | Ceram Schedule | B |
| | Density (g/cm$^3$) | 3.01 |
| | Density Difference (%) | 3.92 |
| | Phase 1 | G |
| | Crystallite Size Phase 1 (Å) | 80 |
| | Phase 2 | T |
| | Crystallite Size Phase 2 (Å) | 103 |
| | Glass (wt %) | 58 |
| | Gahnite (wt %) | 34 |
| | Tet $ZrO_2$ (wt %) | 7.1 |

| Composition | 23 | 34 | 35 | 36 | 37 |
|---|---|---|---|---|---|
| Ceram Schedule | X | X | X | X | X |
| Density (g/cm$^3$) | 2.972 | 2.962 | 3.007 | 2.981 | 2.98 |
| Density Difference (%) | 3.10 | 3.31 | 3.82 | 3.56 | 3.52 |
| Phase 1 | G | G | G | G | G |
| Crystallite Size Phase 1 (Å) | 135 | 170 | 99 | 106 | 136 |
| Phase 2 | T | T | T | T | T |
| Crystallite Size Phase 2 (Å) | 153 | 192 | 132 | 112 | 114 |
| Glass (wt %) | 60 | 60 | 57 | 59 | 60 |
| Gahnite (wt %) | 35 | 36 | 36 | 35 | 35 |
| Tet $ZrO_2$ (wt %) | 4.7 | 4.1 | 7.4 | 5.1 | 5.2 |

| Composition | 34 | 35 | 36 | 37 | 35 | 35 |
|---|---|---|---|---|---|---|
| Ceram Schedule | N | N | N | N | N | Y |
| Density (g/cm$^3$) | 2.981 | 3.016 | 2.993 | 2.991 | 3.014 | 3.015 |
| Density Difference (%) | 3.92 | 4.11 | 3.94 | 3.88 | 4.05 | 4.08 |
| Phase 1 | G | G | G | G | G | G |
| Crystallite Size Phase 1 (Å) | 94 | 79 | 60 | 74 | 87 | 76 |

TABLE 5-continued

| | | | | | | |
|---|---|---|---|---|---|---|
| Phase 2 | T | T | T | T | T | T |
| Crystallite Size Phase 2 (Å) | 47 | 76 | 54 | | | |
| Glass (wt %) | 60 | 59 | 60 | 60 | 59 | 60 |
| Gahnite (wt %) | 36 | 34 | 35 | 35 | 34 | 33 |
| Tet ZrO$_2$ (wt %) | 3.7 | 6.9 | 4.7 | 4.6 | 7.3 | 6.8 |

| | Composition | 35 | 35 | 35 |
|---|---|---|---|---|
| | Ceram Schedule | Z | AB | AA |
| | Density (g/cm$^3$) | 3.011 | 3.015 | 3.013 |
| | Density Difference (%) | 3.95 | 4.08 | 4.02 |
| | Phase 1 | G | G | G |
| | Crystallite Size Phase 1 (Å) | 145 | | |
| | Phase 2 | B3, T | T | T |
| | Crystallite Size Phase 2 (Å) | *, 266 | | |
| | Glass (wt %) | 58 | 61 | 61 |
| | Gahnite (wt %) | 34 | 33 | 32 |
| | Tet ZrO$_2$ (wt %) | 7.6 | 6.8 | 7 |
| | Baddeleyite (wt %) | 0.9 | | |

The crystallite sizes are reported in angstroms. Where an "*" is indicated for the crystallite size, the crystallite size for the relevant phase was not determined.

The hardness was measured with a Vicker's indenter and a 200 gram load. The standard deviation for the measurements is also reported in Table 5.

The scratch threshold was measured using a 30 μm conosphere indenter tip at a sliding velocity of 10 μm/sec for 100 seconds in a toluene environment. Drops of toluene were placed under the indenter tip and replenished during the scratching process to prevent slow crack growth. The applied load was varied from 1 N to 5 N and then refined further between 3.5 N and 4.5 N at 1 N increments until the threshold load was achieved for the transition from ductile to cracking damage response.

Figure 3:
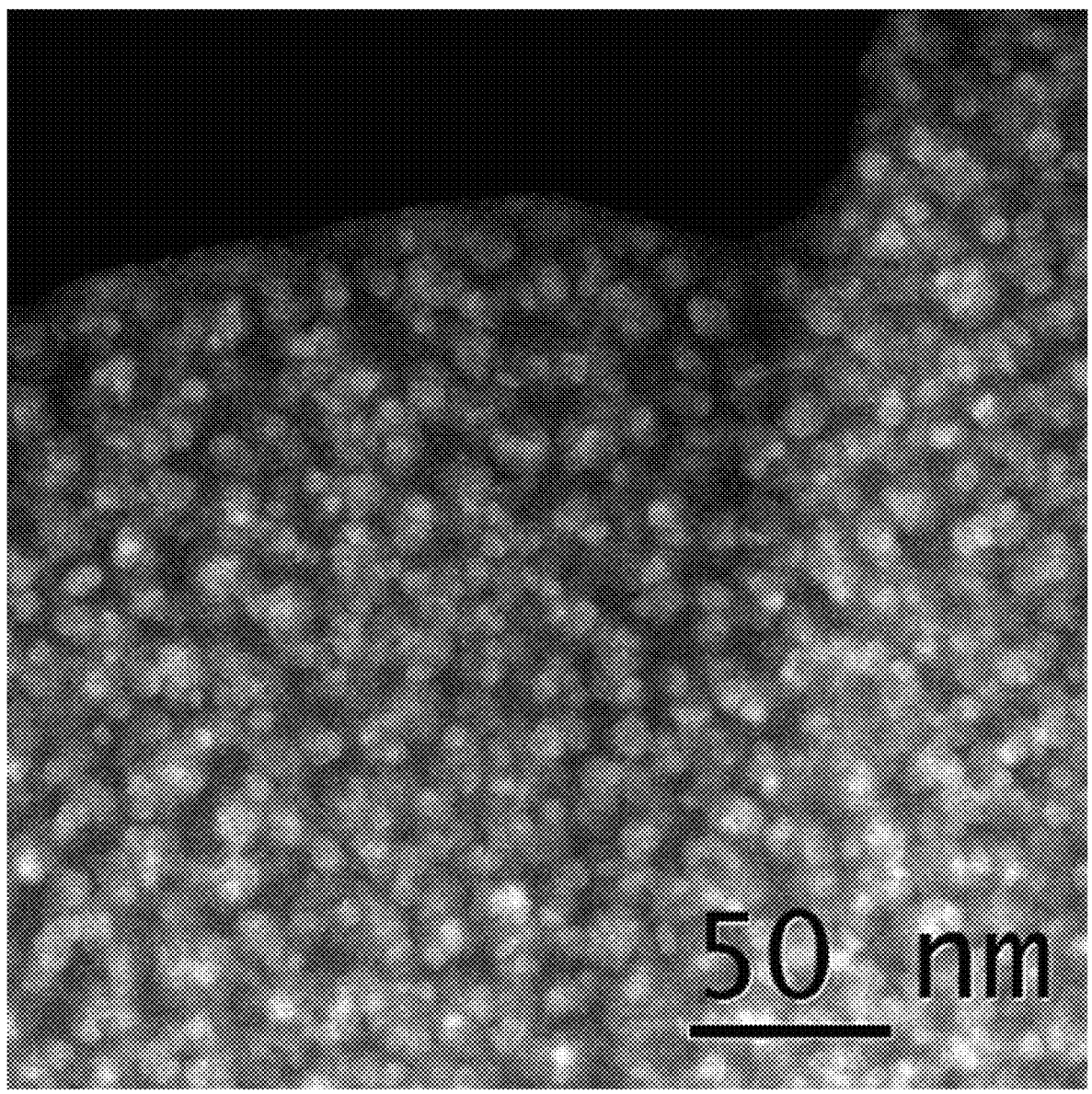
FIG. 3 is a tunneling electron microscope image of a glass ceramic according to an embodiment.

FIG. 3 is a tunneling electron microscope (TEM) image of Example F after being cerammed at 1000° C. for 4 hours. As depicted in the image, small crystal grains are formed throughout the sample. The darkest areas of FIG. 3 correspond to the residual glass phase, the gray areas correspond to the gahnite-spinel solid solution crystal phase, and the brightest areas correspond to a titanium containing tetragonal ZrO$_2$ crystal phase.

Figure 4:
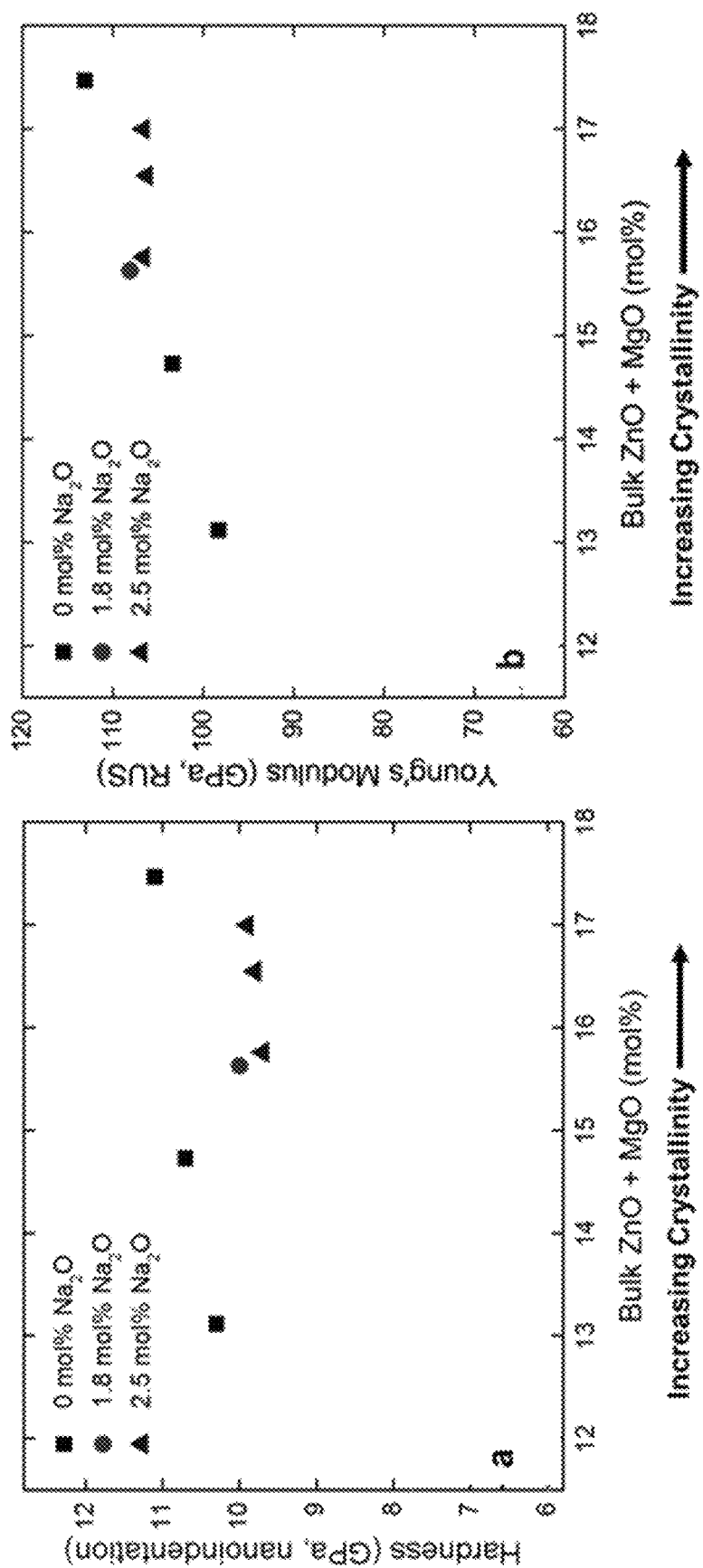
FIG. 4 are plots of the (a) hardness and (b) Young's modulus of various glass ceramics with differing $Na_2O$ contents according to embodiments as a function of bulk ZnO+MgO concentration.

FIG. 4 reports the hardness and Young's modulus of glass ceramics as a function of the bulk concentration of ZnO+MgO in the glass ceramic. Glass ceramics with various Na$_2$O concentrations are reported in FIG. 4. The glass ceramics reported in FIG. 4 are not ion exchanged.

Figure 5:
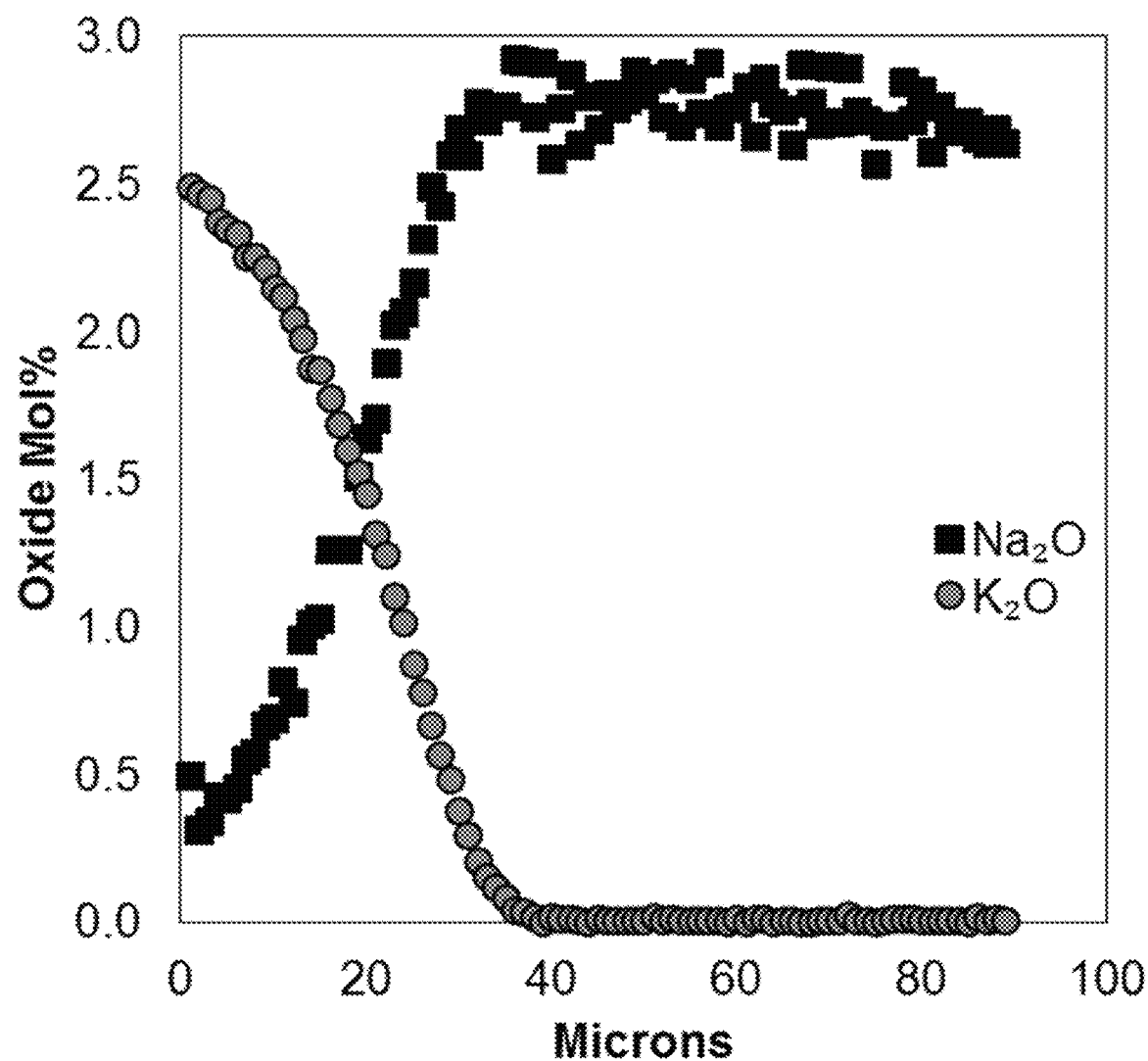
FIG. 5 is a plot of concentration of $Na_2O$ and $K_2O$ as a function of depth below the surface of an ion exchanged glass ceramic according to an embodiment.

A glass ceramic of Example F after being cerammed at 1000° C. for 4 hours was ion exchanged in a molten bath of 100% KNO$_3$ for a period of 19.5 hours at a temperature of 430° C. The resulting concentration of Na$_2$O and K$_2$O as a function of depth below the surface of the glass ceramic was measured by electron probe microanalyzer (EPMA), and is reported in FIG. 5.

Figure 6:
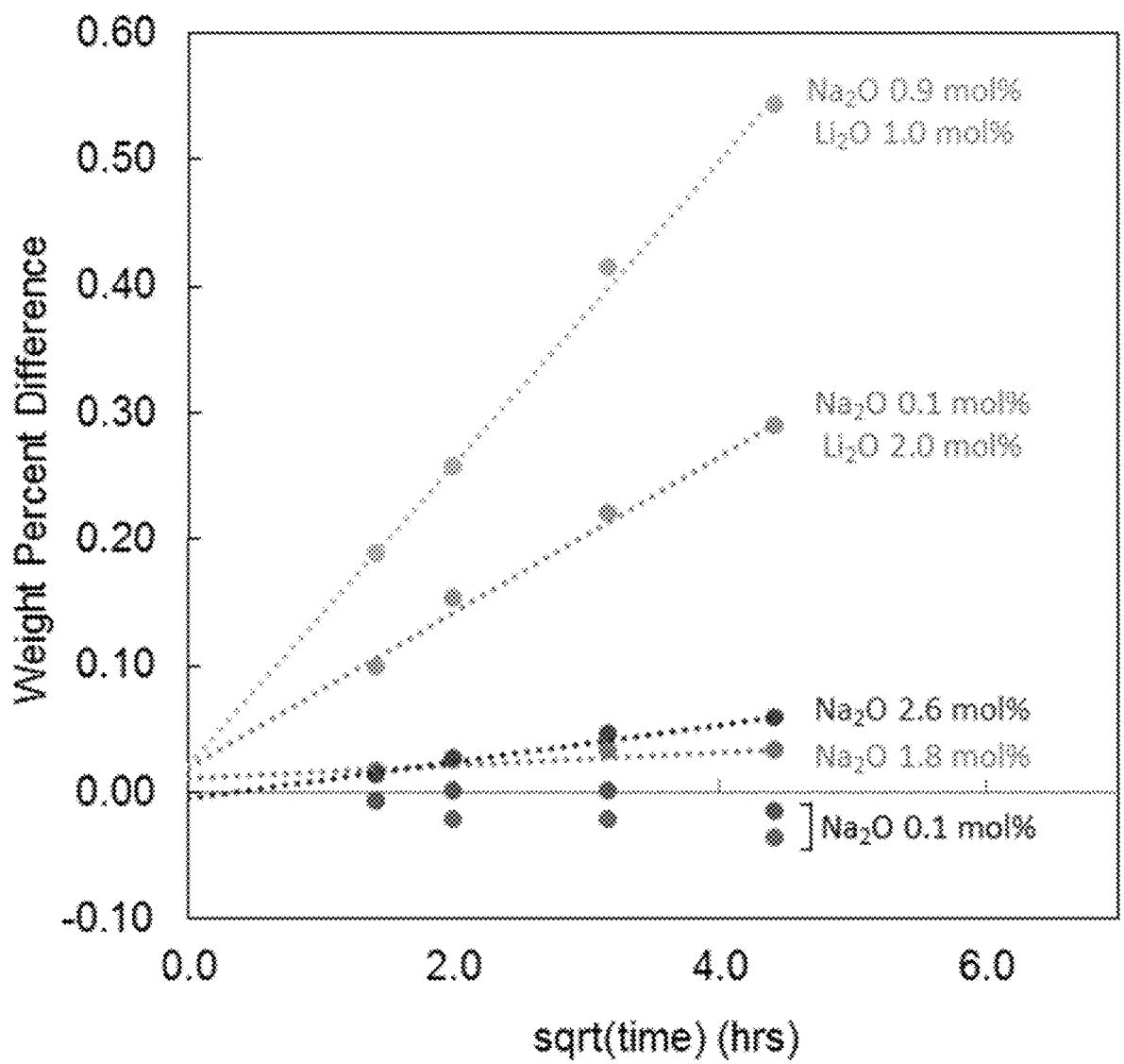
FIG. 6 is a plot of the weight percent difference of various glass ceramics with different alkali metal contents, according to embodiments, as a function of the square root of time during ion exchange.

Glass ceramics were produced with various alkali metal contents, corresponding to Examples 13, 14, 15, 16, and 10, and then ion exchanged in a molten bath of 100% KNO$_3$. The time of ion exchange was normalized as sqrt(t) for the sake of comparison as shown in FIG. 6. The alkali metal concentrations were as shown in FIG. 6, and the change in concentration (wt %) as a function of the square root of time (sqrt(t)) in hours was measured for the various glass ceramics. As shown in FIG. 6, the glass ceramics including a mixture of alkali metal oxides exhibited faster ion exchange.

Figure 7:
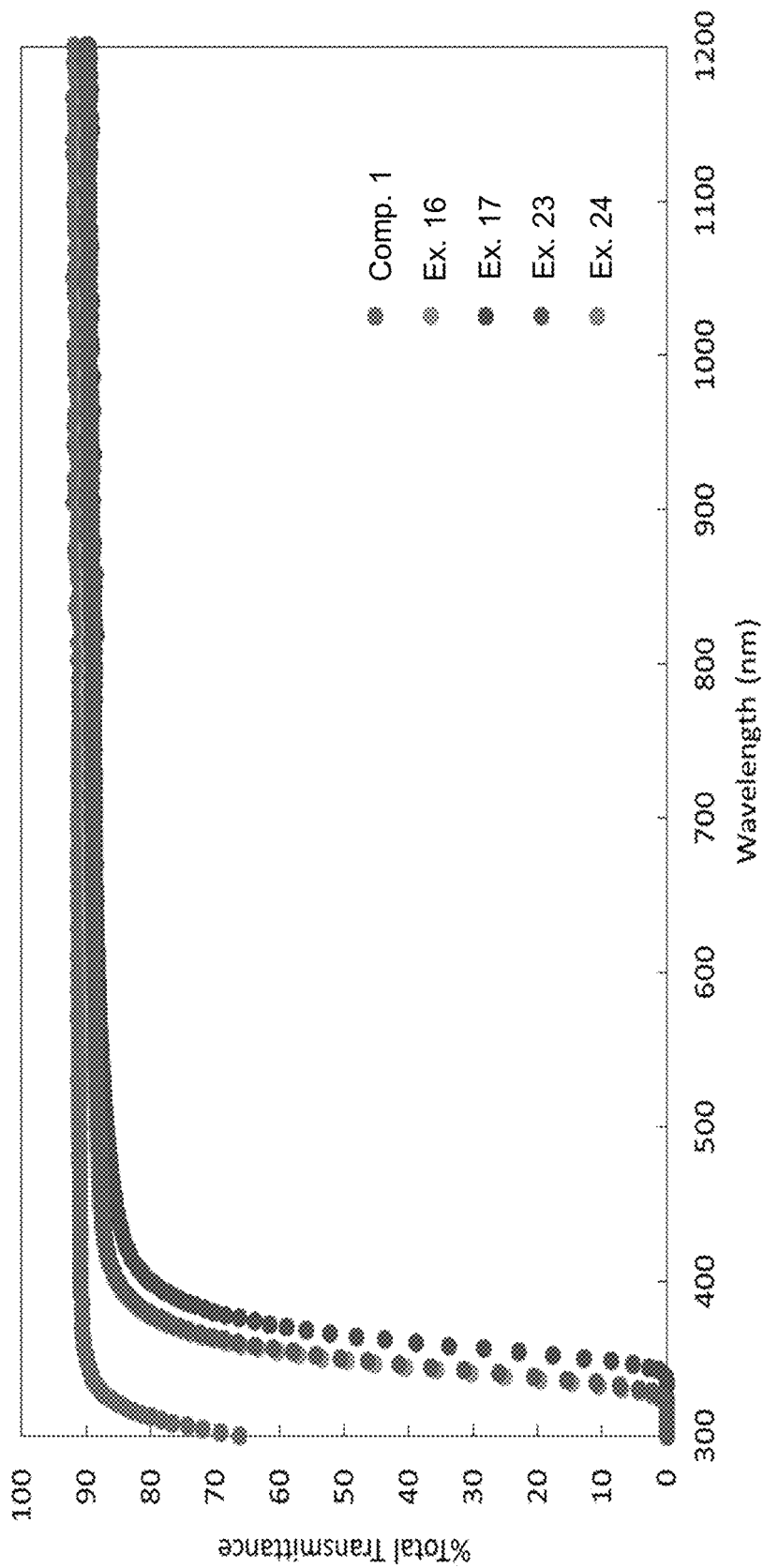
FIG. 7 is a plot of the transmittance of glass ceramics, according to embodiments, and a comparative glass example as a function of wavelength.

The transmittance of glass ceramics having compositions of Examples 16, 17, 23, and 24 and cerammed at 1000° C. for 4 hours was measured as a function of wavelength. A comparative glass sample with a thickness of 1 mm and a composition including: 67.37 mol % SiO$_2$, 3.67 mol % B$_2$O$_3$, 12.73 mol % Al$_2$O$_3$, 13.77 mol % Na$_2$O, 0.01 mol % K$_2$O, 2.39 mol % MgO, 0.01 Fe$_2$O$_3$, 0.01 mol % ZrO$_2$, and 0.09 mol % SnO$_2$ was also analyzed for transmittance. FIG. 7 depicts the measured transmittance of the glass ceramics and the comparative glass sample.

Figure 8:
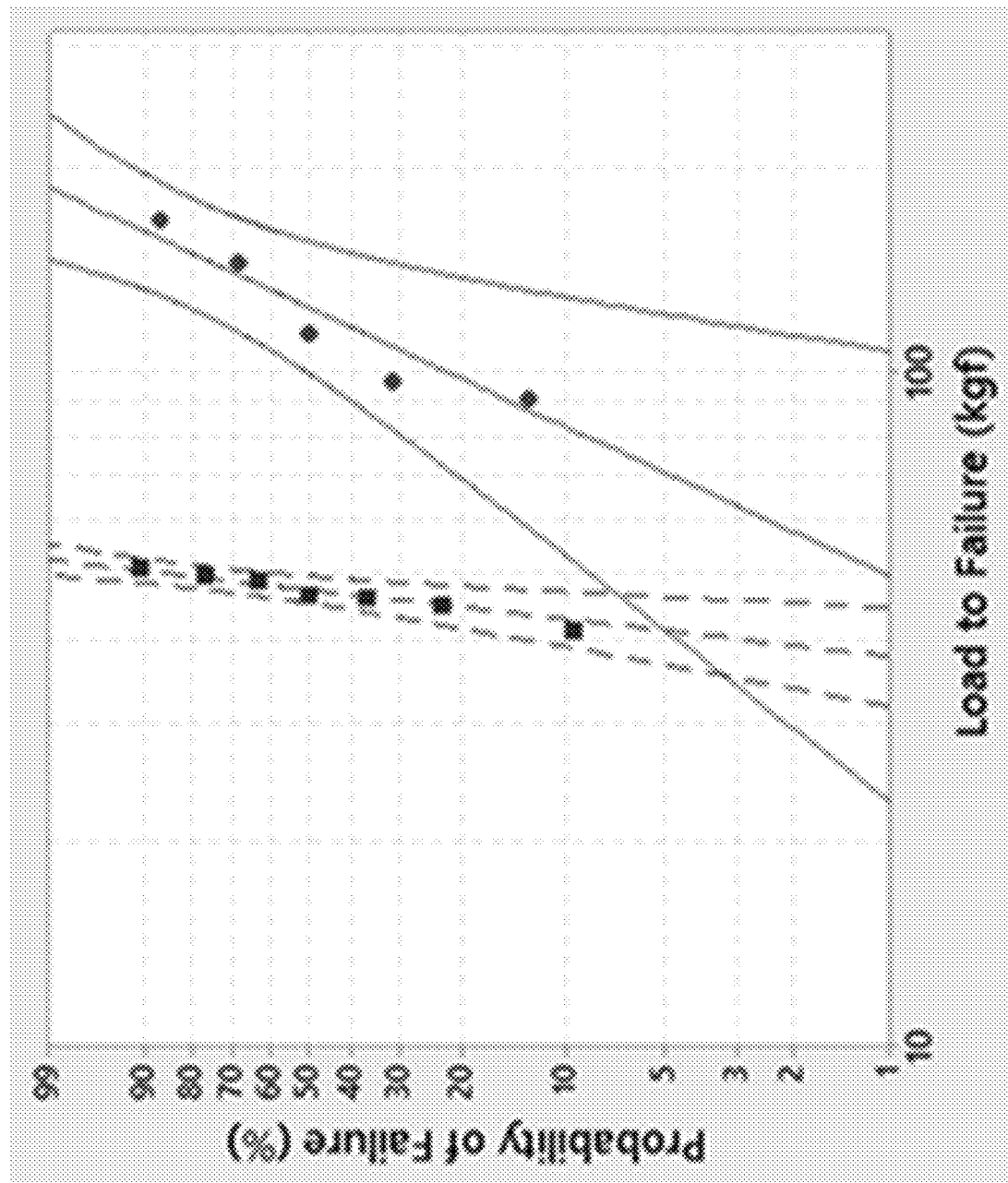
FIG. 8 is a Weibull plot of the ring-on-ring and abraded ring-on-ring test results for a glass ceramic according to an embodiment.

A glass ceramic with the composition of Example 35 was cerammed at 950° C. for 4 hours with a Slow Ramp 1 process. The glass ceramic was then subjected to a ring-on-ring and an abraded ring-on-ring test, with the results shown as a Weibull plot in FIG. 8. The square data points are the abraded ring-on-ring results, and the diamond data points are the ring-on-ring results.

The abraded ring on ring (AROR) test is a surface strength measurement for testing flat glass specimens, and ASTM C1499-09 (2013), entitled "Standard Test Method for Monotonic Equibiaxial Flexural Strength of Advanced Ceramics at Ambient Temperature," serves as the basis for the AROR test methodology described herein. The contents of ASTM C1499-09 are incorporated herein by reference in their entirety. The specimen is abraded prior to ring-on-ring testing with 90 grit silicon carbide (SiC) particles that are delivered to the glass sample at 5 psi using the method and apparatus described in Annex A2, entitled "abrasion Procedures," of ASTM C158-02 (2012), entitled "Standard Test Methods for Strength of Glass by Flexure (Determination of Modulus of Rupture). The contents of ASTM C158-02 and the contents of Annex 2 in particular are incorporated herein by reference in their entirety.

Prior to ring-on-ring testing a surface of the glass-based article is abraded as described in ASTM C158-02, Annex 2, to normalize and/or control the surface defect condition of the sample using the apparatus shown in Figure A2.1 of ASTM C158-02. The abrasive material is sandblasted onto the surface of the glass-based article at an air pressure of 5 psi. After air flow is established, 5 cm$^3$ of abrasive material is dumped into a funnel and the sample is sandblasted for 5 seconds after introduction of the abrasive material.

Figure 9:
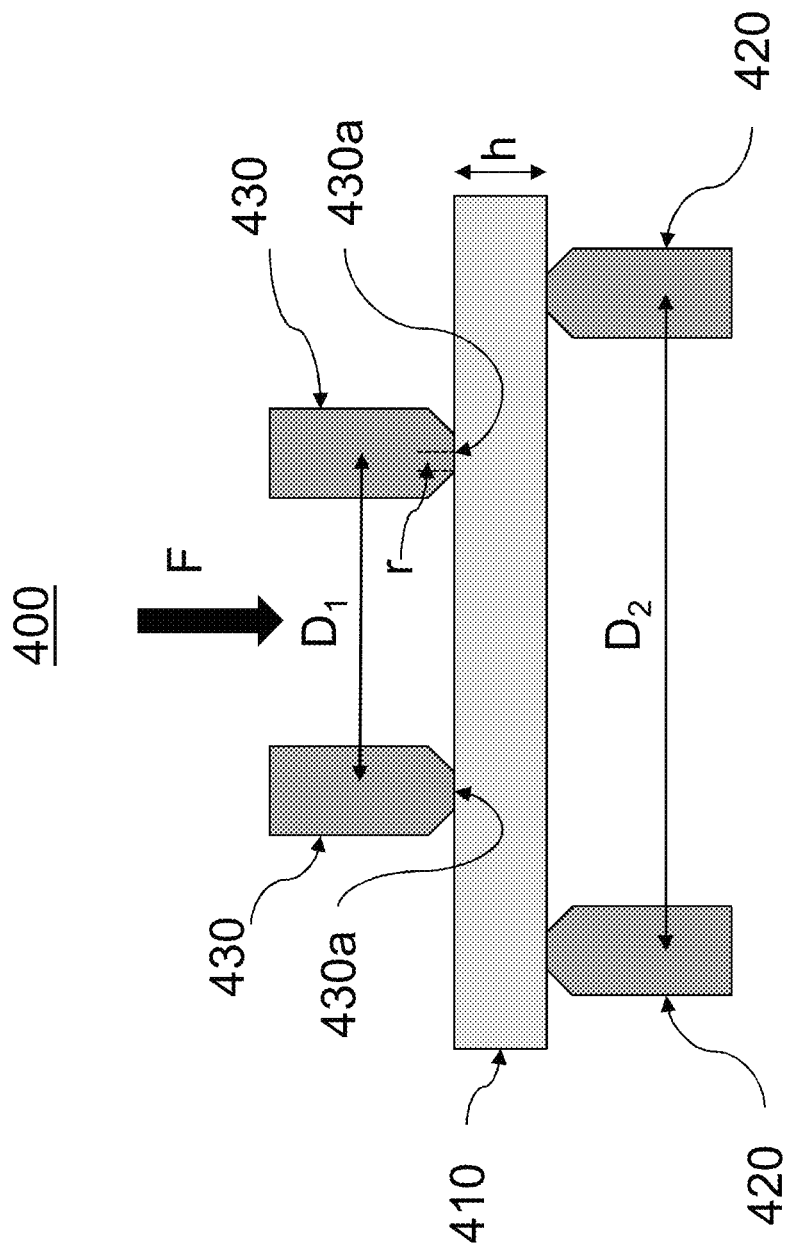
FIG. 9 is a schematic depiction of a ring-on-ring testing apparatus.

For the AROR test, a sample having at least one abraded surface as shown in FIG. 9 is placed between two concentric rings of differing size to determine equibiaxial flexural strength (i.e., the maximum stress that a material is capable of sustaining when subjected to flexure between two concentric rings). In the AROR configuration 400, the abraded glass-based article 410 is supported by a support ring 420 having a diameter D2. A force F is applied by a load cell (not shown) to the surface of the glass-based article by a loading ring 430 having a diameter D1.

The ratio of diameters of the loading ring and support ring D1/D2 may be in a range from 0.2 to 0.5. In some embodiments, D1/D2 is 0.5. Loading and support rings 130, 120 should be aligned concentrically to within 0.5% of support ring diameter D2. The load cell used for testing should be accurate to within ±1% at any load within a selected range. Testing is carried out at a temperature of 23±2° C. and a relative humidity of 40±10%.

For fixture design, the radius r of the protruding surface of the loading ring 430 is in a range of h/2≤r≤3h/2, where h is the thickness of glass-based article 410. Loading and support rings 430, 420 are made of hardened steel with hardness HRc>40. AROR fixtures are commercially available.

The intended failure mechanism for the AROR test is to observe fracture of the glass-based article 410 originating from the surface 430a within the loading ring 430. Failures that occur outside of this region—i.e., between the loading ring 430 and support ring 420—are omitted from data analysis. Due to the thinness and high strength of the glass-based article 410, however, large deflections that exceed ½ of the specimen thickness h are sometimes observed. It is therefore not uncommon to observe a high percentage of failures originating from underneath the loading ring 430. Stress cannot be accurately calculated without knowledge of stress development both inside and under the ring (collected via strain gauge analysis) and the origin of failure in each specimen. AROR testing therefore focuses on peak load at failure as the measured response.

The ring-on-ring test is performed in the same manner as the AROR test, with the exception of the pre-test abrasion step.

The strength of glass-based article depends on the presence of surface flaws. However, the likelihood of a flaw of a given size being present cannot be precisely predicted, as the strength of glass is statistical in nature. A probability distribution can therefore be used as a statistical representation of the data obtained.

All compositional components, relationships, and ratios described in this specification are provided in mol % unless otherwise stated. All ranges disclosed in this specification include any and all ranges and subranges encompassed by the broadly disclosed ranges whether or not explicitly stated before or after a range is disclosed.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A glass-ceramic, comprising:
   a first crystal phase including $(Mg_xZn_{1-x})Al_2O_4$ where x is less than 1; and
   a second crystal phase including tetragonal $ZrO_2$,
   wherein the glass-ceramic is transparent in the visible range.

2. The glass-ceramic of claim 1, further comprising at least one of $Li_2O$ and $Na_2O$.

3. The glass-ceramic of claim 1, further comprising $Li_2O$ and $Na_2O$.

4. The glass-ceramic of claim 1, wherein x is greater than 0.

5. The glass-ceramic of claim 1, further comprising from greater than or equal to 35 mol % to less than or equal to 70 mol % $SiO_2$.

6. The glass-ceramic of claim 1, further comprising:
   35 mol % to 60 mol % $SiO_2$;
   greater than 13 mol % $Al_2O_3$;
   greater than 8 mol % ZnO;
   0 mol % to 8 mol % MgO; and
   greater than 0 mol % to 10 mol % $ZrO_2$.

7. The glass ceramic of claim 6, further comprising:
   0 mol % to 6 mol % $TiO_2$;
   0 mol % to 10 mol % $Na_2O$;
   0 mol % to 8 mol % $Li_2O$;
   0 mol % to 10 mol % $HfO_2$;
   0 mol % to 0.1 mol % $As_2O_5$; and
   0 mol % to 0.3 mol % $SnO_2$.

8. The glass-ceramic of claim 1, wherein $ZrO_2+TiO_2+HfO_2≥5$ mol %.

9. The glass-ceramic of claim 1, wherein the glass ceramic is substantially free of $TiO_2$.

10. The glass-ceramic of claim 1, wherein the glass ceramic exhibits a crystallinity of at least 10 wt %.

11. The glass-ceramic of claim 1, wherein the glass ceramic has a transmittance of at least 90% in the visible range.

12. The glass-ceramic of claim 1, wherein the glass ceramic is substantially colorless.

13. The glass-ceramic of claim 1, wherein the first crystal phase has a crystallite size of less than 10 nm.

14. The glass-ceramic of claim 1, further comprising a compressive stress region extending from a surface of the glass ceramic to a depth of compression.

15. The glass-ceramic of claim 1, wherein the glass ceramic has a hardness of at least 9 GPa.

16. The glass-ceramic of claim 1, wherein the glass ceramic has a Young's modulus of at least 98 GPa.

17. A consumer electronic product, comprising:
    a housing comprising a front surface, a back surface and side surfaces;

electrical components at least partially within the housing, the electrical components comprising at least a controller, a memory, and a display, the display at or adjacent the front surface of the housing; and a cover substrate disposed over the display, wherein at least a portion of at least one of the housing or the cover substrate comprises the glass ceramic of claim 1.

18. A method, comprising:

cerammming a precursor glass to form a glass ceramic that is transparent in the visible range, wherein the glass ceramic comprises:

a first crystal phase including $(Mg_xZn_{1-x})Al_2O_4$ where x is less than 1; and a second crystal phase including tetragonal $ZrO_2$.

19. The method of claim 18, further comprising forming nuclei in the precursor glass prior to the ceramming.

20. The method of claim 19, wherein the forming nuclei comprises heat treating the precursor glass at a temperature of at least 700° C. for a time period of at least 1 hour.

21. The method of claim 18, wherein the ceramming comprises heat treating the precursor glass at a temperature of at least 750° C. for a time period of at least 30 minutes.

22. The method of claim 18, further comprising ion exchanging the glass ceramic.

23. The method of claim 22, wherein the ion exchanging comprises contacting the glass ceramic with a mixed ion exchange bath.

* * * * *